United States Patent
Wada et al.

(10) Patent No.: US 12,362,762 B2
(45) Date of Patent: Jul. 15, 2025

(54) DELTA-SIGMA MODULATOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shotaro Wada, Nisshin (JP); Tomohiro Nezuka, Nisshin (JP); Yoshikazu Furuta, Nisshin (JP)

(73) Assignees: DENSO CORPORATION, Kariya (JP); TOYOTA JIDOSHA KABUSHIKI KAISHA, Toyota (JP); MIRISE Tehcnologies Corporation, Nisshin (JP)

( * ) Notice: Subject to any disclaimer, the term of this patent is extended or adjusted under 35 U.S.C. 154(b) by 209 days.

(21) Appl. No.: 18/340,070

(22) Filed: Jun. 23, 2023

(65) Prior Publication Data
US 2023/0421170 A1 Dec. 28, 2023

(30) Foreign Application Priority Data
Jun. 27, 2022 (JP) .................. 2022-102697

(51) Int. Cl.
*H03M 3/00* (2006.01)
(52) U.S. Cl.
CPC .......... *H03M 3/322* (2013.01); *H03M 3/422* (2013.01)
(58) Field of Classification Search
CPC ......... H03M 3/00; H03M 3/322; H03M 3/422
See application file for complete search history.

(56) References Cited

U.S. PATENT DOCUMENTS

| | | | | |
|---|---|---|---|---|
| 4,994,804 A | * | 2/1991 | Sakaguchi | H03M 3/34 |
| | | | | 341/172 |
| 7,714,757 B2 | | 5/2010 | Denison et al. | |
| 7,795,960 B2 | | 9/2010 | Lyden et al. | |
| 8,736,474 B1 | * | 5/2014 | Wang | H03M 3/454 |
| | | | | 708/271 |
| 8,791,754 B2 | | 7/2014 | Lyden et al. | |
| 9,391,628 B1 | | 7/2016 | Lyden et al. | |
| 9,525,431 B1 | * | 12/2016 | Chen | H03M 3/426 |
| 9,712,184 B2 | * | 7/2017 | Breems | H03M 3/376 |
| 10,135,459 B2 | | 11/2018 | Sharma et al. | |
| 10,158,334 B2 | | 12/2018 | Wang et al. | |
| 10,158,335 B2 | | 12/2018 | Quilligan et al. | |

(Continued)

*Primary Examiner* — Lam T Mai
(74) *Attorney, Agent, or Firm* — POSZ LAW GROUP, PLC

(57) ABSTRACT

A delta-sigma modulator includes a capacitively-coupled amplifier, a first integrator, a second integrator, a quantizer, a first switch, a second switch, and a control circuit. The first switch is connected between an input of the capacitively-coupled amplifier and a sampling capacitor of the capacitively-coupled amplifier to execute a chopping operation. The second switch is connected between an output of the capacitively-coupled amplifier and an input of the first integrator to execute a chopping operation. The control circuit executes modulation through the first switch at the input of the capacitively-coupled amplifier, executes demodulation through the second switch at the output of the capacitively-coupled amplifier, and imports an output signal of the capacitively-coupled amplifier into the first integrator after the demodulation.

8 Claims, 27 Drawing Sheets

(56) References Cited

U.S. PATENT DOCUMENTS

| | | | |
|---|---|---|---|
| 11,502,700 B2 * | 11/2022 | Hunter | H03M 1/804 |
| 2006/0082480 A1 * | 4/2006 | Oprescu | H03M 3/322 |
| | | | 341/122 |
| 2010/0208114 A1 * | 8/2010 | Kwon | H04N 25/78 |
| | | | 348/308 |
| 2014/0218223 A1 * | 8/2014 | Darshan | H03M 3/39 |
| | | | 341/143 |
| 2016/0149586 A1 * | 5/2016 | Roh | G06G 7/184 |
| | | | 327/337 |
| 2022/0109452 A1 * | 4/2022 | Gupta | H03M 3/464 |
| 2023/0208435 A1 * | 6/2023 | Makinwa | H03M 3/342 |
| | | | 341/143 |
| 2023/0299787 A1 * | 9/2023 | Chang | H03M 3/462 |
| | | | 341/143 |

* cited by examiner

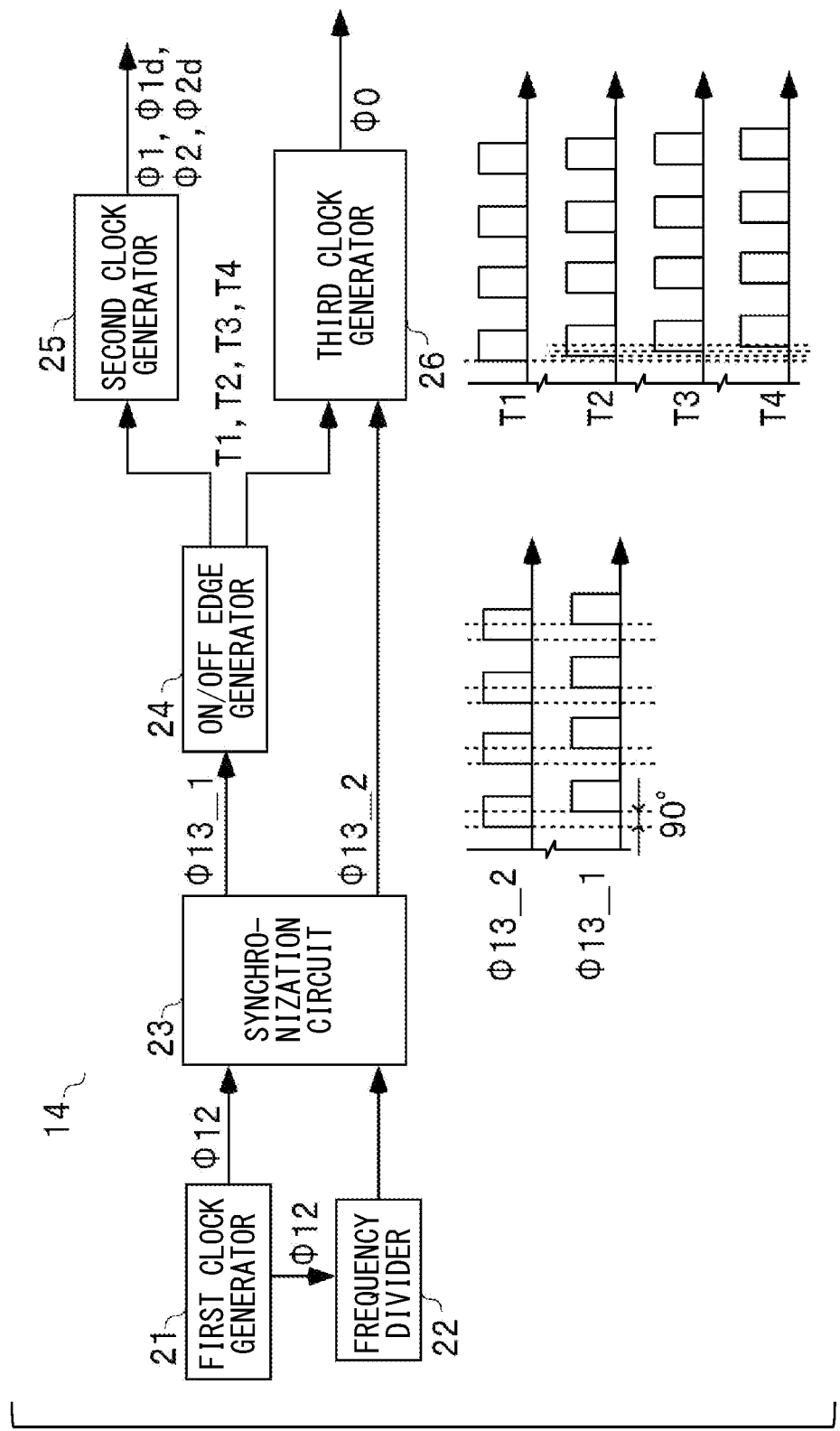

Φ1=ON, Φ1d=ON, Φ2=OFF, Φ2d=OFF
Φ1din=Φ1dout=ON, Φ2din=Φ2dout=OFF

DELTA-SIGMA MODULATOR

CROSS REFERENCE TO RELATED APPLICATION

This application is based on Japanese Patent Application No. 2022-102697 filed on Jun. 27, 2022, the disclosure of which is incorporated herein by reference.

TECHNICAL FIELD

The present disclosure relates to a delta-sigma modulator.

BACKGROUND

A delta-sigma modulator may have an amplifier for amplifying an analog signal in proportion to a ratio between a first capacitance and a second capacitance of a capacitive differential circuit and providing the amplified analog signal, and the analog signal amplified by the amplifier may be integrated by an integrator. Further, the delta-sigma modulator may generate a digital output signal based on an analog differential signal amplified by a capacitive differential amplifier circuit.

SUMMARY

The present disclosure describes a delta-sigma modulator including a capacitively-coupled amplifier, a first integrator, a second integrator, a quantizer, a digital-to-analog converter, a first switch, a second switch, and a control circuit.

BRIEF DESCRIPTION OF DRAWINGS

FIG. 2A illustrates a structure of a control circuit according to the first embodiment.

DETAILED DESCRIPTION

Figure 1:
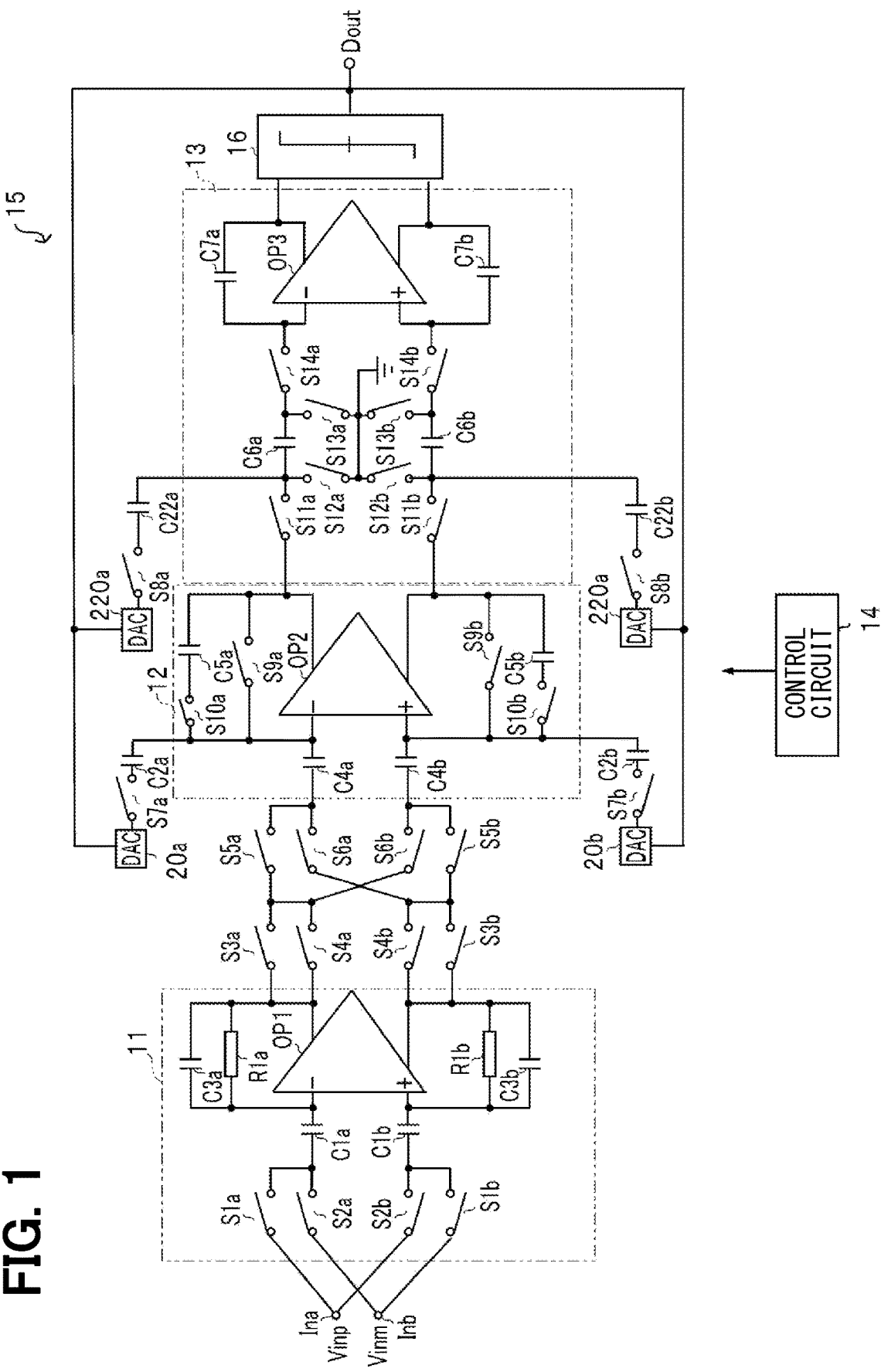
FIG. 1 illustrates an electrical structure of a delta-sigma modulator according to a first embodiment.

An offset voltage may be generated in an output of a capacitive differential amplifier circuit in a delta-sigma modulator according to a comparative example. A first integrator provided after the capacitive differential amplifier circuit may have a structure having high sensitivity to an error of an input voltage. Therefore, it is possible that a desired output may not be acquired as a final output due to influence of an offset of a capacitively-coupled amplifier in the delta-sigma modulator according to the above-described comparative example.

Since an output capacitance of the capacitively-coupled amplifier is distinct in each differential operation due to the electrical characteristics of the capacitance, an output impedance of the capacitively-coupled amplifier differs between the differential operations when viewed from the first integrator provided after the capacitive differential amplifier circuit. Then, the injection amount of a switch inside the first integrator may change in different differential operations that may be seen as an error.

According to a first aspect of the present disclosure, a delta-sigma includes a capacitively-coupled amplifier, a first integrator, a second integrator, a quantizer, a digital-to-analog converter, a first switch, a second switch, and a control circuit. The first capacitively-coupled amplifier includes a sampling capacitor, a feedback capacitor, and an operational amplifier, and amplifies an analog input signal. The first integrator is a correlated double sampling integrator, and is a first-stage integrator located after the capacitively-coupled amplifier. The second integrator is located after the first integrator. The quantizer is located after the second integrator to quantize an output value of the second integrator.

The digital-to-analog converter executes digital-to-analog conversion of an output of the quantizer, and executes feedback of the output of the quantizer to the first integrator and the second integrator after the digital-to-analog conversion of the output of the quantizer. The first switch is connected between an input of the capacitively-coupled amplifier and the sampling capacitor of the capacitively-coupled amplifier to execute a chopping operation. The second switch is connected between an output of the capacitively-coupled amplifier and an input of the first integrator to execute a chopping operation. The control circuit executes modulation by controlling the first switch to execute the chopping operation at the input of the capacitively-coupled amplifier, executes demodulation by controlling the second switch to execute the chopping operation at the output of the capacitively-coupled amplifier, and imports an output signal of the capacitively-coupled amplifier into the first integrator after the demodulation.

According to the above structure, although an offset may occur at the output of the capacitively-coupled amplifier, the control executes the modulation through the chopping operation of the first switch and the demodulation through the chopping operation of the second switch. Since the output signal of the capacitively-coupled amplifier has a DC value converging to an average value by repeating a change between a positive value and a negative value, the offset does not affect the final output. Even though the first integrator has a stronger sensitivity to an error dependent on an input voltage, the error does not affect the output signal. Therefore, it is possible to reduce the offset for the circuit as a whole.

According to the above-described comparative example, an operational frequency of an input switching device cannot be made to be identical to an operational frequency of an operational frequency of a capacitive differential amplification circuit. In addition, in a case where a resistor such as an anti-aliasing filter is located before the input switching device, a voltage drop may occur at the resistor through absorbing charges in a switched-capacitor operation and lead to a detection error.

In contrast, according to a second aspect of the present disclosure, by adopting a first switch for chopping and a second switch for chopping, the control circuit can lower the driving frequency of each of the first and second switches for operating the chopping operation at a frequency being a half of a predetermined frequency. Since the amount of current flowing through the switches decreases, the detection error caused by the voltage drop decreases.

Several embodiments of delta-sigma modulators are hereinafter described with reference to the drawings. The term "delta-sigma" may also be expressed as "ΔΣ". In each embodiment, substantially the same or similar parts are given the same reference numeral or a similar reference numeral (for example, the same number is added to the one's and ten's digits and another number is added to the hundred's digit), and the description thereof is omitted as necessary. And, in each embodiment, the feature portions will be mainly described. Further, in the following embodiment, a differential circuit will be used for description, and the circuit components having a symmetrical differential configuration will be illustrated and described with subscripts a and b.

First Embodiment

The following describes a first embodiment with reference to FIGS. 1 to 8. FIG. 1 illustrates a structure of a delta-sigma modulator 15. The delta-sigma modulator 15 includes a capacitively-coupled amplifier 11, a first integrator 12, a second integrator 13 and a control circuit 14. A quantizer 16 is provided at the output stage of the second integrator 13. The delta-sigma modulator 15 executes feedback of the output of the quantizer 16 to the first integrator 12 through digital-to-analog (D/A) converters 20a and 20b, and executes feedback of the output of the quantizer 16 to the second integrator 13 through D/A converters 220a and 220b.

The control circuit 14 includes a microcomputer, a logic circuit, or the like, and outputs a control signal to each configuration of the capacitively-coupled amplifier 11, the first integrator 12, the second integrator 13, the quantizer 16, and the D/A converters 20a, 20b, 220a, and 220b.

The differential analog input signals Vinp and Vinm are provided to the capacitively-coupled amplifier 11 through the input terminals Ina and Inb. At this time, a voltage of about "Vinp−Vinm=±100 mV" is applied. Since a common mode voltage Vcm is also provided to the input terminals Ina and Inb, the voltages of "Vinp=+Vdiff/2+Vcm" and "Vinm=−Vdiff/2+Vcm" are provided to the input terminals Ina and Inb, respectively.

The capacitively-coupled amplifier 11 mainly includes a fully differential type operational amplifier OP1. A parallel circuit of a resistor R1a and a capacitor C3a and a parallel circuit of a resistor R1b and a capacitor C3b are connected between the input and output of the operational amplifier OP1. Each of the capacitors C3a and C3b provide a feedback capacitance. The resistors R1a and R1b are provided to determine the input voltage. Further, capacitors C1a and C1b having sampling capacitances are connected between the input terminals Ina and Inb and the inverting input terminal and the non-inverting input terminal of the operational amplifier OP1, respectively.

Further, switches S1a and S2b are interposed and connected between the input terminal Ina and the inverting input terminal and the non-inverting input terminal of the operational amplifier OP1, respectively. Switches S2a and S1b are interposed and connected between the input terminal Inb and the inverting input terminal and the non-inverting input terminal of the operational amplifier OP1, respectively. By turning the switches S1a, S1b, S2a, and S2b on and off through the control circuit 14, the analog input signals Vinp and Vinm can be polarly inverted and input to the operational amplifier OP1. The switches S1a, S1b, S2a and S2b correspond to the first switch SW1 for chopping connected between the input of the capacitively-coupled amplifier 11 and the capacitors C3a and C3b. No switch is interposed between the input and output of the operational amplifier OP1.

The output of the capacitively-coupled amplifier 11 is provided to the first integrator 12. In other words, the capacitively-coupled amplifier 11 that amplifies the analog input signals Vinp and Vinm is connected before the first integrator 12. Further, switches S3a, S3b, S4a, S4b, S5a, S5b, S6a, and S6b are connected to each other between the output of the operational amplifier OP1 and the input of the capacitors C4a, C4b of the first integrator 12 in an illustrated manner. The switches S3, S4 correspond to a second switch connected between the output of the capacitively-coupled amplifier 11 and the input of the first integrator 12. The switches S5, S6 correspond to a third switch connected between each of the switches S3, S4 and the input of the first integrator 12. Each of these switches S3, S4, S5, S6 represents a switch for switching, for example, the output polarity of the capacitively-coupled amplifier 11 between forward and reverse.

The first integrator 12 corresponds to a first-stage integrator, and is a so-called correlation double sampling (CDS) type integrator. The first integrator 12 also mainly includes a fully differential operational amplifier OP2. The output of the operational amplifier OP1 is provided to the capacitor C4 and the switches S3 to S6.

A short-circuit switching path and an energization path of the capacitor C5 are connected in parallel between the input and output of the operational amplifier OP2. A switch S9 is configured between the input and output of the operational amplifier OP2 in the short-circuit switching path. The capacitor C5 and the switch S8 are connected in series to the energization path of the capacitor C5, and the charging and discharging of the capacitor C5 can be switched by using a switch S10.

The output of the first integrator 12 is provided to the second integrator 13. The second integrator 13 also mainly includes a fully differential operational amplifier OP3. The output of the operational amplifier OP2 is connected to the input of the operational amplifier OP3 via the capacitor C6. Further, switches S11a, S11b, S12a, S12b, S13a, S13b, S14a, and S14b are connected to each other between the output of the operational amplifier OP2 and the input of the operational amplifier OP3 in an illustrated manner.

These switches S11 to S14 are switched when charging from the capacitor C5 of the first integrator 12 to the capacitor C6 of the second integrator 13 or when discharging the capacitor C6.

Capacitors C7a and C7b are connected as feedback capacitors between the input and output of the operational amplifier OP3. The switches S14a and 514b indicate switches that can be switched when the capacitor C7 is charged from the capacitor C6. The output of the operational amplifier OP3 is connected to the input of the quantizer 16. Also, no switch is interposed between the output of the operational amplifier OP3 and the input of the quantizer 16.

The quantizer 16 converts the level of the output of the second integrator 13 into a digital signal Dout. Further, the digital signal Dout of the quantizer 16 is provided to the D/A converters 20a, 20b, 220a and 220b. The D/A converters 20a and 20b execute feedback to the first integrator 12 based on the some values of the digital signal Dout output from the quantizer 16. The D/A converters 20a and 20b are circuits that output some levels, based on the digital signal Dout.

The switches S7a and S7b and the capacitors C2a and C2b are connected in series between the D/A converters 20a and 20b and the input of the operational amplifier OP2 constituting the first integrator 12, and, when the control circuit 14 turns on the switches S7a and S7b, the D/A converters 20a and 20b execute feedback to the first integrator 12. The operational amplifier OP2 corresponds to a second operational amplifier.

The D/A converters 220a and 220b execute feedback to the second integrator 13 based on the some values of the digital signal Dout output from the quantizer 16. The D/A converters 220a and 220b are circuits that output some levels, based on the digital signal Dout.

The switches S8a and S8b and the capacitors C6a and C6b are connected in series between the D/A converters 220a and 220b and the input of the operational amplifier OP2 included in the first integrator 12, and, when the control circuit 14 turns on the switches S8a and S8b, the D/A converters 220a and 220b execute feedback to the first integrator 12.

The following describes an electrical structure of the control circuit 14 and a method of forming the control signal. As illustrated in FIG. 2A, the control circuit 14 includes a master clock generator 21, a frequency divider 22, a synchronization circuit 23, an on/off edge generator 24, and clock generators 25 and 26. The master clock generator 21 may adopt, for example, a crystal oscillator. The master clock generator 21 generates a master clock ϕ12 with high accuracy, and outputs the master clock ϕ12 to the frequency divider 22 and the synchronization circuit 23. The master clock generator 21 may also be referred to as a first clock generator as illustrated in FIG. 2A. The clock generator 25 may also be referred to as a second clock generator as illustrated in FIG. 2A. The clock generator 26 may also be referred to as a third clock generator as illustrated in FIG. 2A.

Figure 2B:
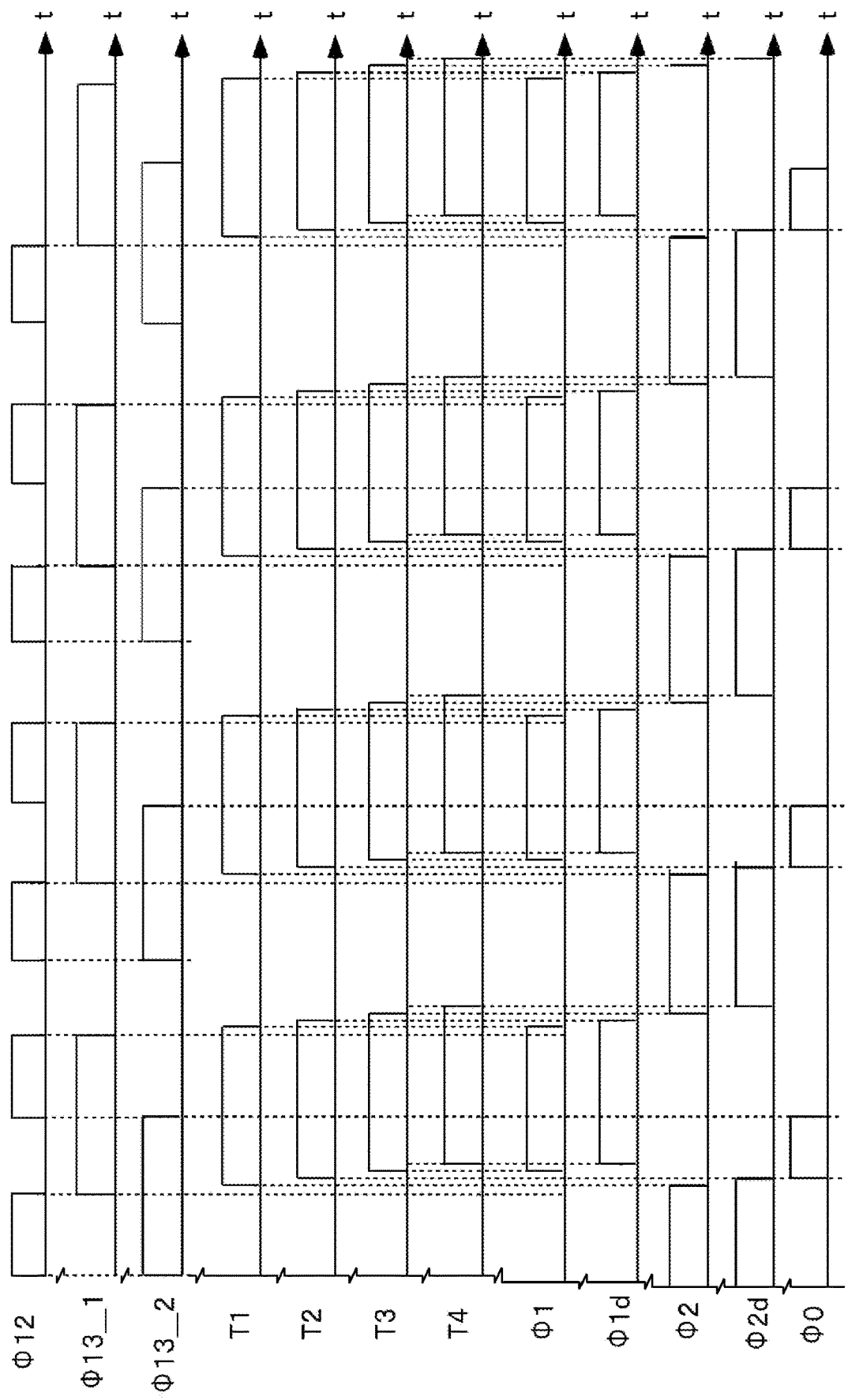
FIG. 2B illustrates a method of forming a control signal in the first embodiment.

FIG. 2B illustrates a time chart that shows the relationship among the master clock ϕ12, various control signals ϕ13_1, ϕ13_2, ϕ1, ϕ1d, ϕ2, ϕ2d, and ϕ0, and the original signals T1 to T4. When the master clock ϕ12 is input, the frequency divider 22 divides the frequency of the master clock ϕ12 by two and outputs it to the synchronization circuit 23. The synchronization circuit 23 generates control signals ϕ13_1 and ϕ13_2 from the master clock ϕ12 and the output of the frequency divider 22. The synchronization circuit 23 generates control signals ϕ13_1 and ϕ13_2 obtained by shifting the outputs of frequency divider 22 by 90 degrees as ADC operating frequency signals, and outputs the control signals ϕ13_1 and ϕ13_2 to the on/off edge generator 24 and the clock generator 26, respectively. In other words, as illustrated in FIG. 2A, the control signal ϕ13_2 is delayed by a phase difference of 90 degrees with respect to the control signal ϕ13_1. The synchronization circuit 23 synchronizes with the master clock ϕ12 and generates the control signal ϕ13_1 by dividing the frequency of the master clock ϕ12 by half. The control signal ϕ13_1 corresponds to a third control signal. The control signal ϕ13_2 corresponds to the fourth control signal, and the falling edge of the control signal ϕ13_2 indicates the signal that defines the falling edge of the control signal ϕ0.

The on/off edge generator 24 generates the original signals T1, T2, T3, and T4 of the above-mentioned control signals ϕ1, ϕ1d, ϕ2, and ϕ2d for generating a control signal for delaying the control signal ϕ13_1 by only a predetermined time from degree. The original signals T1, T2, T3 and T4 are generated by gradually delaying the rising edge of the control signal ϕ13_1 by a predetermined time. The on/off edge generator 24 delays the control signal ϕ13_1 by a second predetermined time to generate the original signal T2. Alternatively, the on/off edge generator 24 may delay the control signal ϕ1 by a third predetermined time to generate the original signal T2. The original signal T2 corresponds to a fifth control signal, and the rising edge of the original signal T2 indicates the signal that defines the rising edge of the control signal ϕ0.

The clock generator 25 is a clock generator adopted for a switched capacitor, and generates the control signals ϕ1, ϕ1d, ϕ2, and ϕ2d for controlling the charging and discharging of the capacitors C1 to C7. The control signal ϕ1 corresponds to a first control signal. The on/off edge generator 24 delays the control signal ϕ13_1 to generate the original signals T1 and T3, and the clock generator 25 adopts the edges of the original signals T1 and T3 to generate the control signal ϕ1 in a phase identical to the phase of the control signal ϕ13_1. The on/off edge generator 24 delays the control signal ϕ13_1 by a first predetermined time to generate the control signal ϕ1.

Figure 2C:
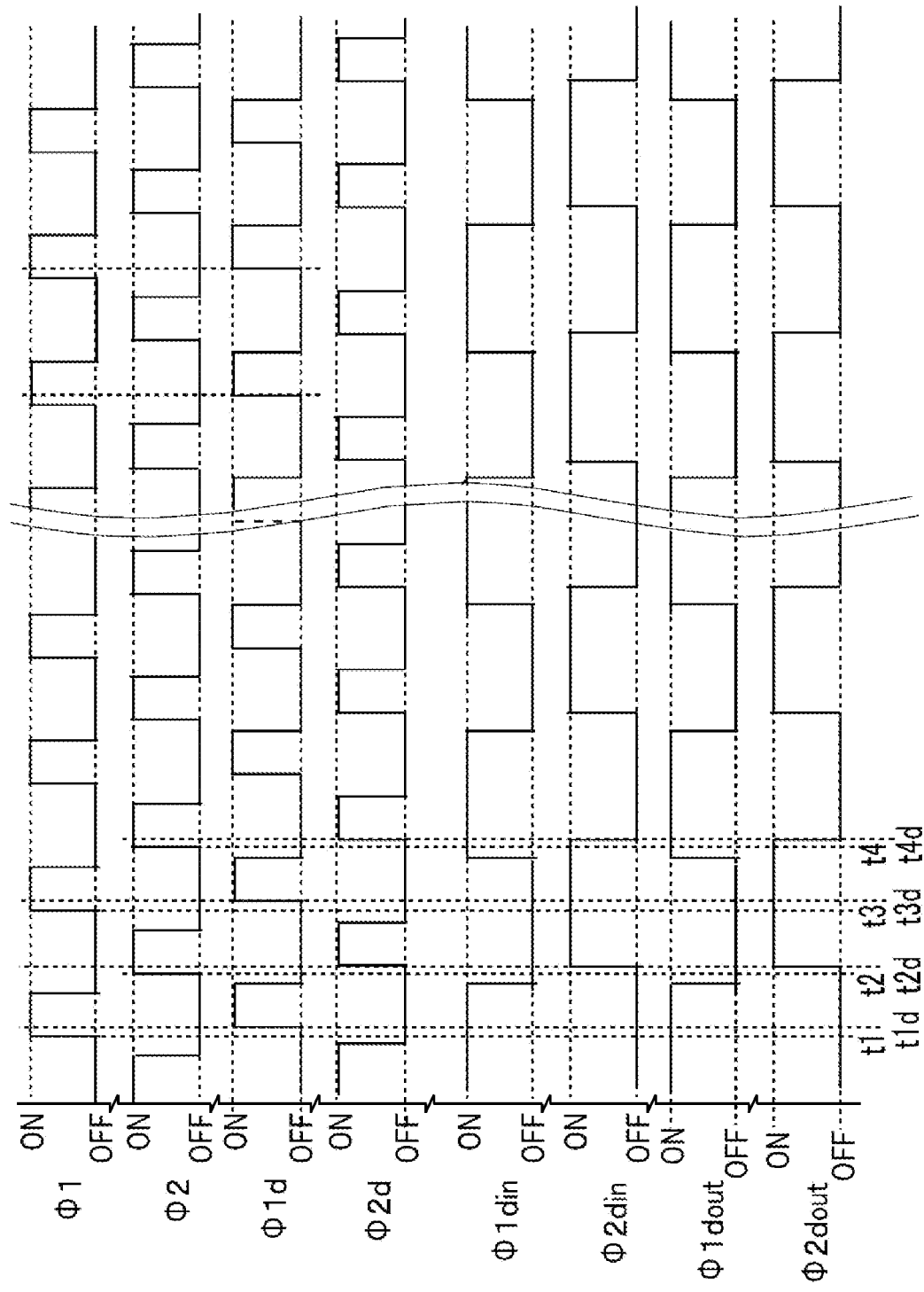
FIG. 2C illustrates a timing chart schematically showing a signal change in each device in the first embodiment.
Figure 4:
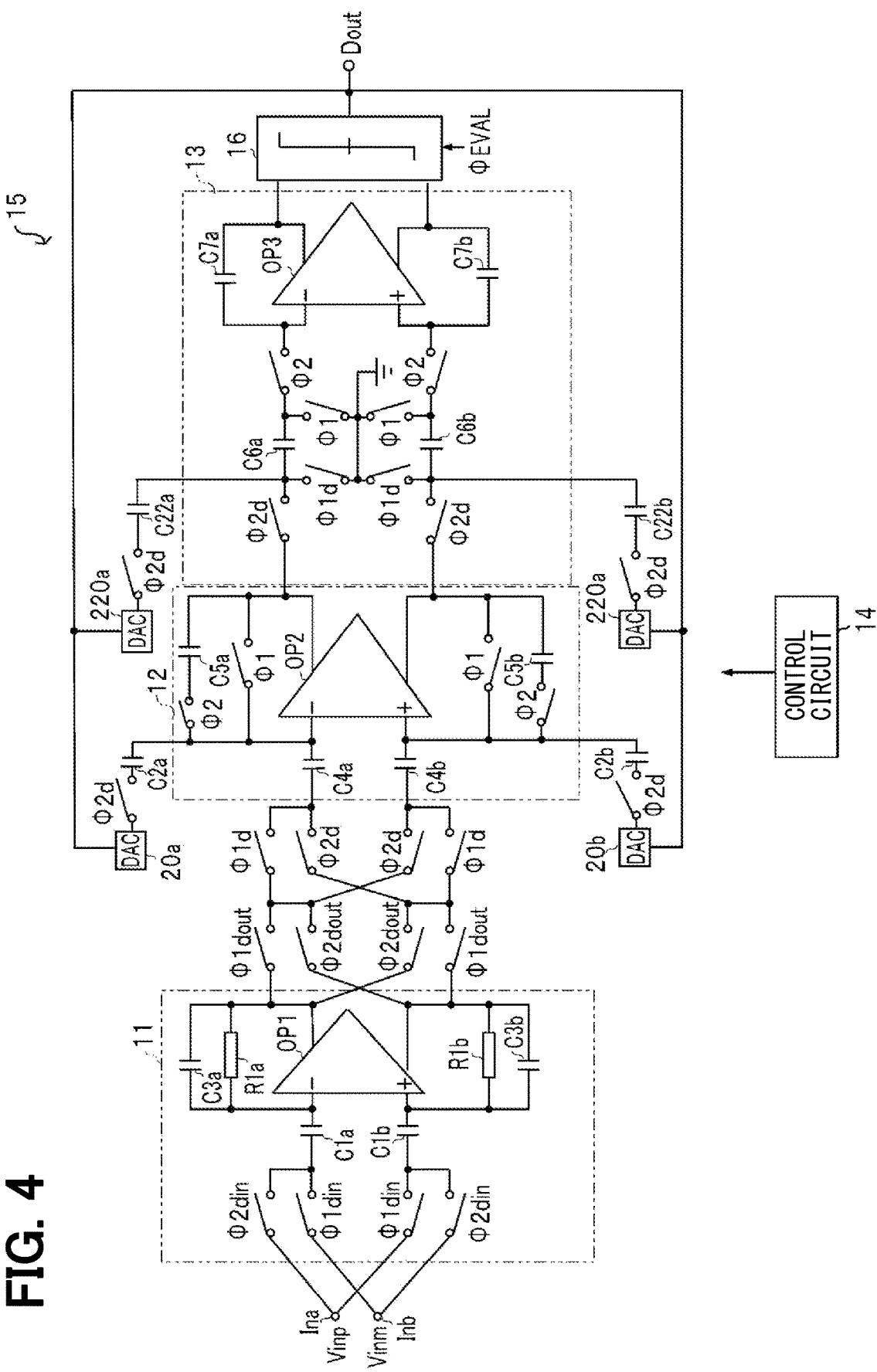
FIG. 4 is a correspondence diagram of control signals respectively provided to switches in the first embodiment.

FIG. 2C illustrates the control signals ϕ1, ϕ2, ϕ1d, ϕ2d applied to the respective switches. FIG. 4 illustrates which of the switches are applied by the control signals ϕ1, ϕ1d, ϕ2, and ϕ2d. The clock generator 26 is a clock generator for resetting a capacitively-coupled amplifier described later in the present embodiment, and generates the control signal ϕ0.

The control signal φ0 is defined by the rising edge of the control signal φ1d and falls at the subsequent falling edge of φ13_2. The usage of the control signal φ0 is described hereinafter in the embodiment. The control signal φ0 corresponds to a second control signal.

The control signals φ1 and φ2 are controls signals for complementary turning on/off, and the control signals φ1d and φ2d are also control signals for complementary turning on/off. That is, the control signal φ1 and the control signal φ2 are non-overlapping, and the control signal φ1d and the control signal φ2d are also non-overlapping. Further, the control signals φ1d and φ2d are control signals output so as to be slightly delayed as compared with the control signals φ1 and φ2. The control signals φ1din and φ1dout are control signals generated by dividing the frequency of the control signal φ1d by two, and indicate control signals that are switched between an on-state (ON) and an off-state (OFF) at the falling edge of the control signal φ1d. The control signals φ2din and φ2dout are control signals generated by dividing the frequency of the control signal φ2d by two, and indicate control signals that are switched between ON and OFF at the rising edge of the control signal φ2d.

As shown in FIGS. 2C, 4, the control circuit 14 outputs the control signals φ2, φ1d, φ1din, φ1dout, φ2d, φ2din and φ2d to the target switches S1a, S1b to S15a, and S15b to control the switches S1a, S1b to S15a, and S15b to turn on and off. Refer to FIGS. 5 to 8 for detailed on/off control contents of the switches S1a, S1b to S15a, and S15b.

Figure 3A:
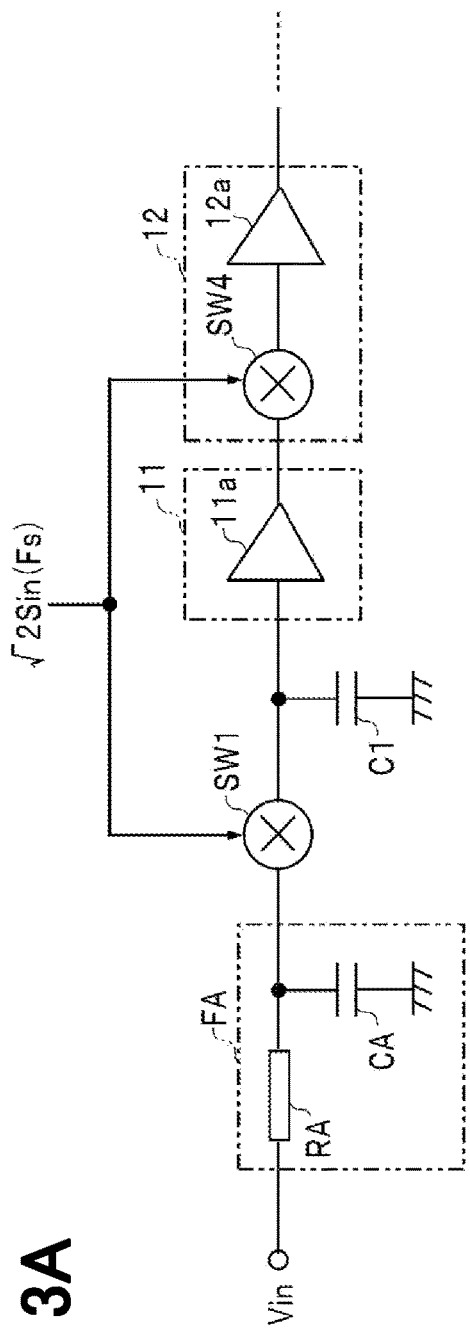
FIG. 3A illustrates a delta-sigma modulator in a comparative example.
Figure 3B:
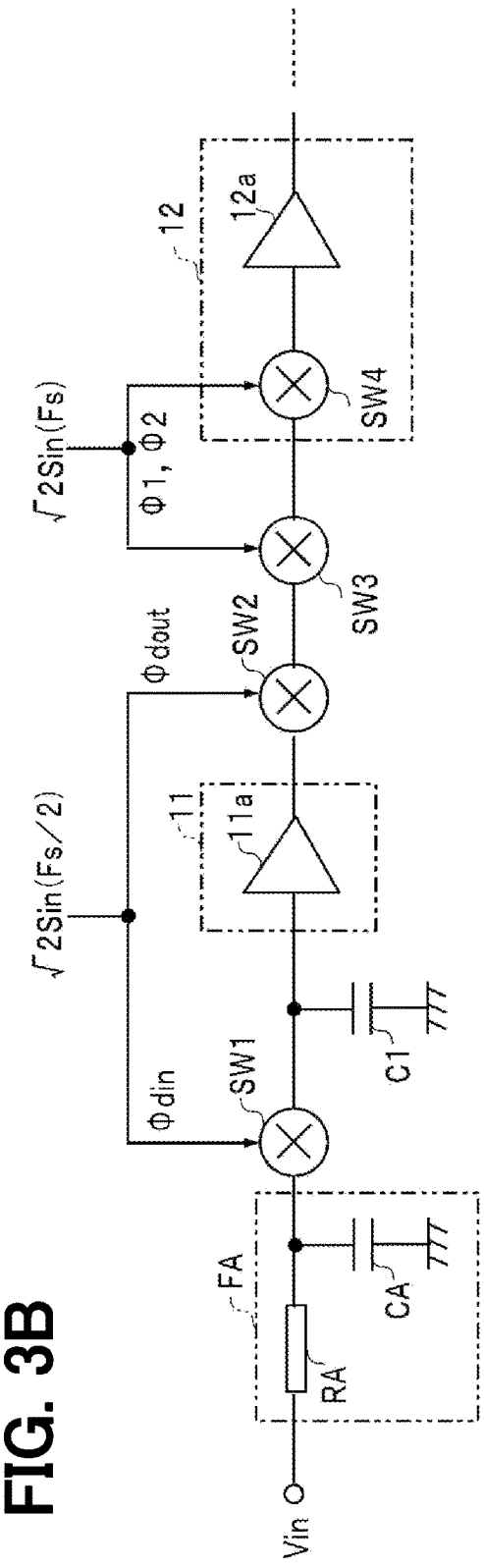
FIG. 3B illustrates the delta-sigma modulator in the first embodiment.

FIG. 3A illustrates a comparative example. FIG. 3B illustrates the circuit shown in FIG. 1 related to the present embodiment as a block diagram. In each of FIGS. 3A and 3B, the switched capacitor configuration is partially omitted.

FIG. 3B illustrates that a first switch SW1 having the switches S1 and S2 is connected to the input of the capacitively-coupled amplifier 11, and a second switch SW2 having the switches S3 and S4 is connected to the output of the capacitively-coupled amplifier 11. In FIG. 3B, the frequency of the control signals φ1, φ2, φ1d, φ2d are set as a predetermined reference frequency Fs. Since the first integrator 12 and the second integrator 13 are driven by the control signals φ1, φ2, φ1d, and φ2d, the reference frequency Fs is the driving frequency of the first integrator 12 and the second integrator 13.

Figure 23:
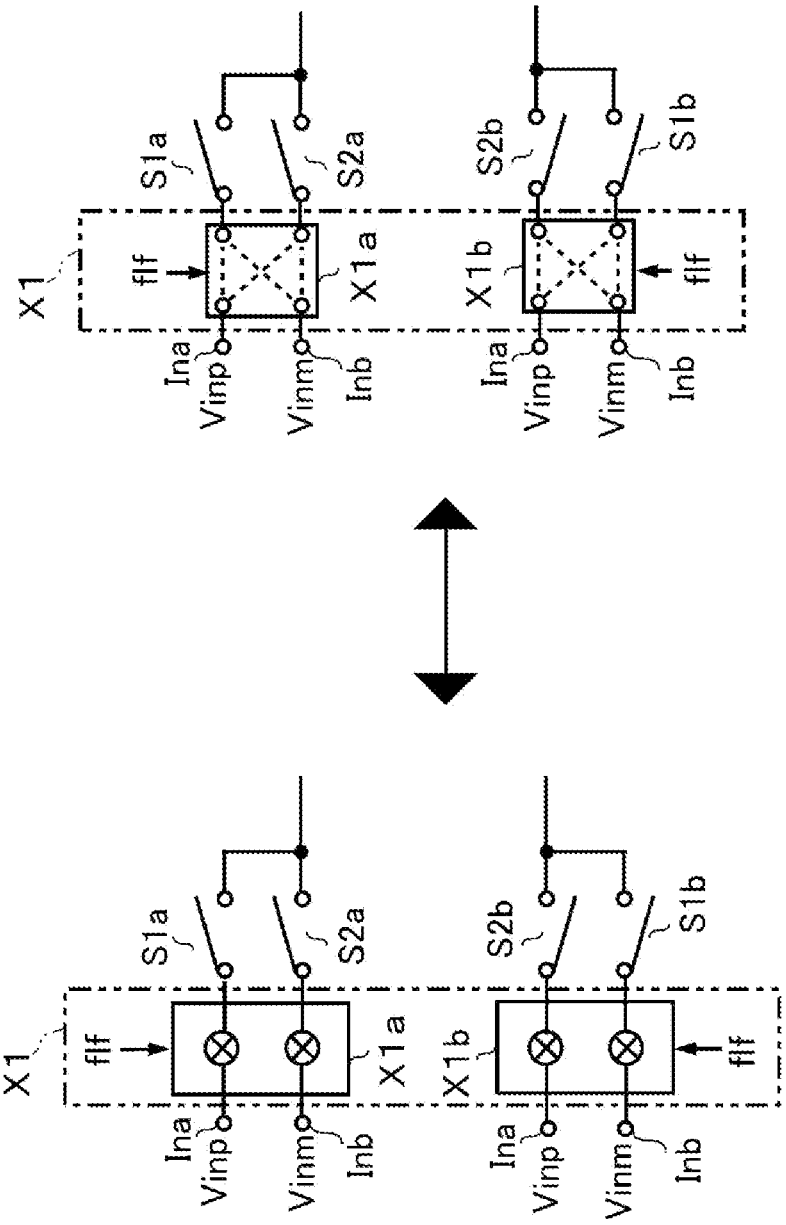
FIG. 23 illustrates a first equivalent circuit of a polarity conversion switch in the fourth embodiment.
Figure 24:
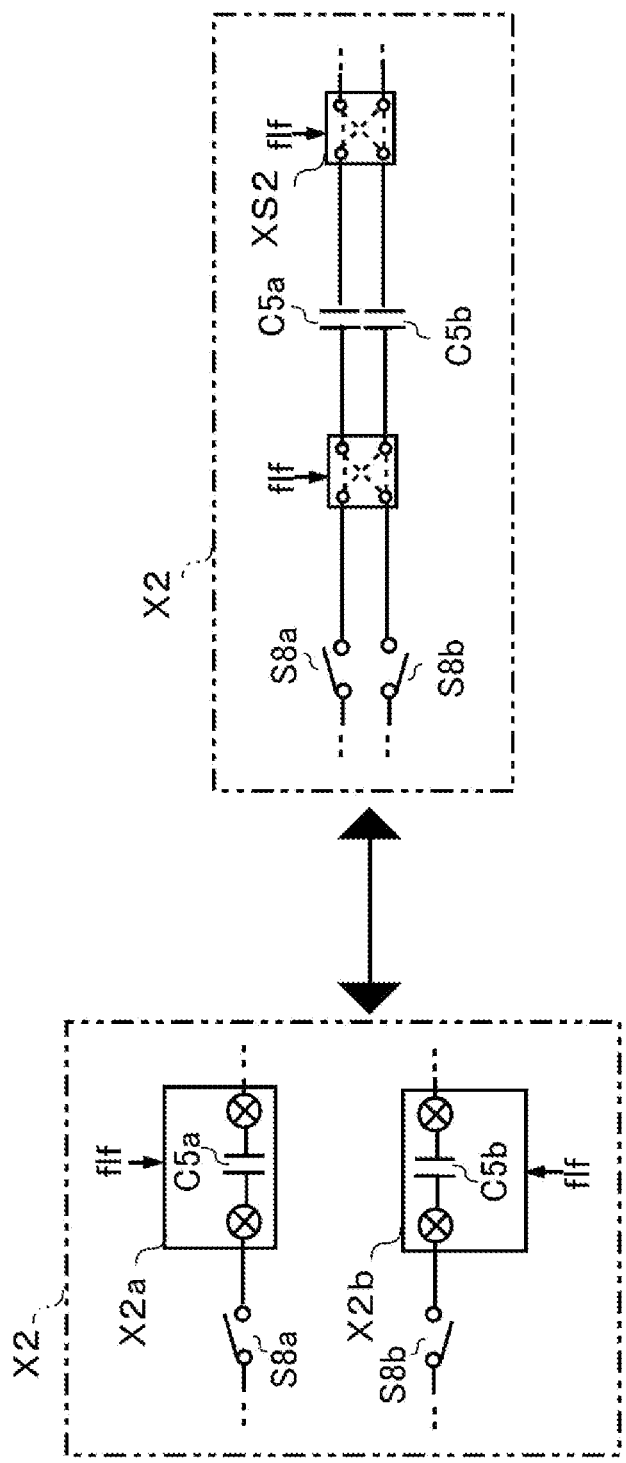
FIG. 24 is a second equivalent circuit diagram of a polarity conversion switch in the fourth embodiment.
Figure 25:
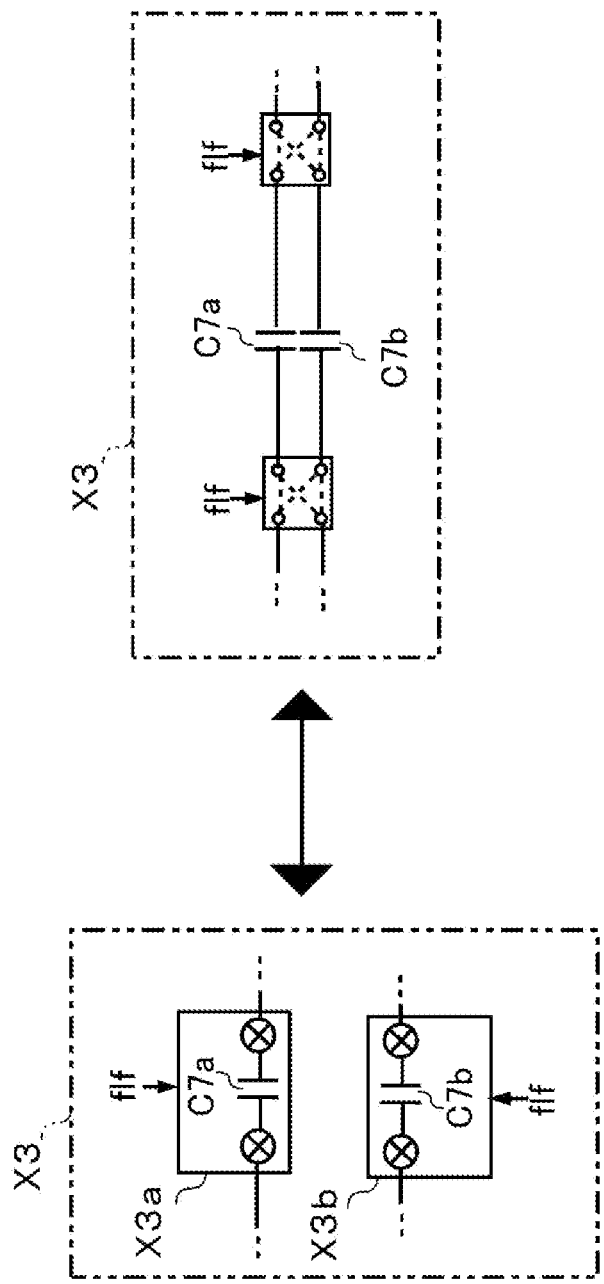
FIG. 25 is a third equivalent circuit diagram of a polarity conversion switch showing in the fourth embodiment.

The first switch SW1 having the switches S1 and S2 are driven by the control signals φ1din and φ2din. Therefore, by repetitively turning on and off the switches S1 and S2, the charging and discharging of the capacitor C1 as the input capacitance of the capacitively-coupled amplifier 11 are repeated at a frequency Fs/2 being a half of the reference frequency Fs, and the chopping operation occurs at the input unit of the capacitively-coupled amplifier 11. As a result, the input unit of the capacitively-coupled amplifier 11 for modulating the analog input signals Vinp and Vinm is configured to perform chopping operation. The term "chopping operation" described in the present application broadly refers to switching the polarity of input connection or output connection. For example, as illustrated in FIGS. 23 to 25, polarity inversion circuits X1 to X3 execute switchover between the input connection and the output connection.

The second switch SW2 having the switches S3 and S4 are driven by the control signals φ1dout and φ2dout. The second switch SW2 is repeatedly turned on and off at a frequency Fs/2 being a half of the predetermined reference frequency Fs, and executes the chopping operation at the output unit of the capacitively-coupled amplifier 11. The output of the capacitively-coupled amplifier 11 and the third switch SW3 having the switches S5 and S6 are separated.

Thus, demodulation is performed by chopping the output of the capacitively-coupled amplifier 11 through the second switch SW2. Thus, the first switch SW1 and the second switch SW2 are respectively provided before and after the capacitively-coupled amplifier 11 so as to be driven at the frequency Fs/2, respectively, and the chopping frequency is restricted to a half of the reference frequency Fs.

The third switch SW3 and the fourth switch SW4 are provided after the second switch SW2. The third switch SW3 includes the switches S5 and S6, and the fourth switch SW4 includes the switches S9 and S10. Since the third switch SW3 is turned on and off by the control signals φ1d and φ2d, the chopping operation is performed at the input of the first integrator 12 by the reference frequency Fs to separate the second switch SW2 and the capacitor C4. In the present embodiment, the first integrator 12 can receive the input of the demodulated output signal of the capacitively-coupled amplifier 11 by switching the third switch SW3. The fourth switch SW4 is turned on and off by the control signals φ1 and φ2 and driven at the reference frequency Fs.

When the control circuit 14 drives the first integrator 12 with the control signal at the predetermined phase timing of the reference frequency Fs, the control circuit 14 executes chopping operation at the predetermined timing of the reference frequency Fs identical to the timing of driving the third switch SW3 at the input of the first integrator 12 and the fourth switch SW4 included in the first integrator 12. The first switch SW1 and the second switch SW2 are under the chopping operation at the frequency Fs/2 being a half of the reference frequency Fs of the control signal φ1.

(Explanation of ON/OFF Operation of Each Switch and Flow of Signal Processing)

Figure 5:
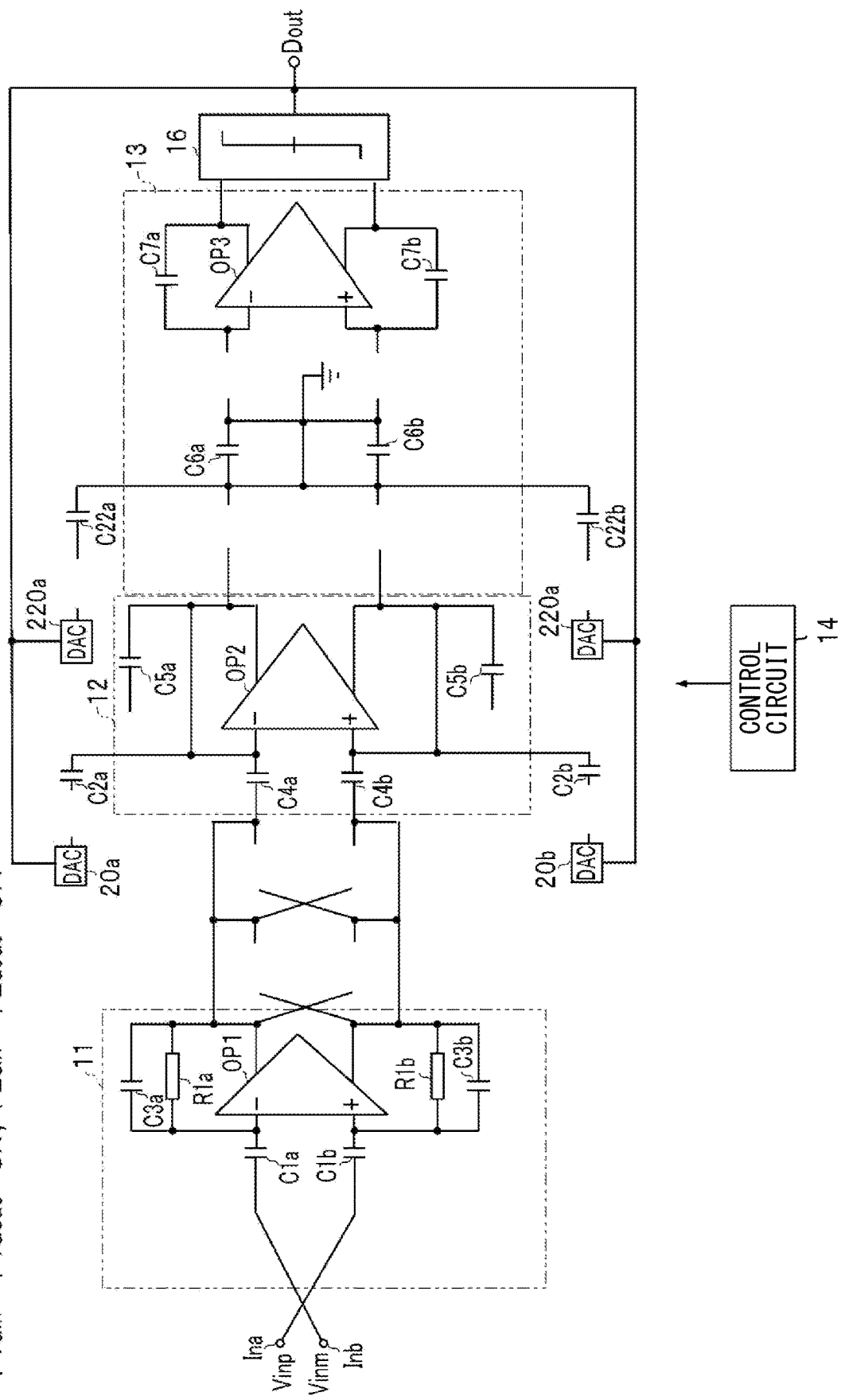
FIG. 5 illustrates a first electrical structure showing one of operation states in the first embodiment.

The following describes the flow and operation of the signal processing with reference to FIGS. 5 to 8. FIG. 5 shows the connection state when the control signals of "φ1=ON", "φ1d=ON", "φ2=OFF", "φ2d=OFF", "φ1din=ON", "φ1dout=ON", "φ2din=OFF", and "φ2dout=OFF". When the control signals φ1, φ2, φ1d, and φ2d become the state of "φ1=ON", "φ1d=ON", "φ$_2$=OFF", "φ2d=OFF", "φ1din=ON", "φ1dout=ON", "φ2din=OFF", and "φ2dout=OFF" at the timings t1 and t1d in FIG. 2C, the wiring connection shown in FIG. 5 is established.

At this time, a straight connection is made between the output of the capacitively-coupled amplifier 11 and the input of the first integrator 12. The analog input signals Vinp, Vinm are provided to the capacitor C1 of the capacitively-coupled amplifier 11. After the capacitively-coupled amplifier 11 amplifies the input signal, the input signal is subsequently sampled by the capacitor C4 that functions as the sampling capacitance of the first integrator 12. Further, since the switch S10 is turned off, the charge of the capacitor C5 is maintained.

Figure 6:
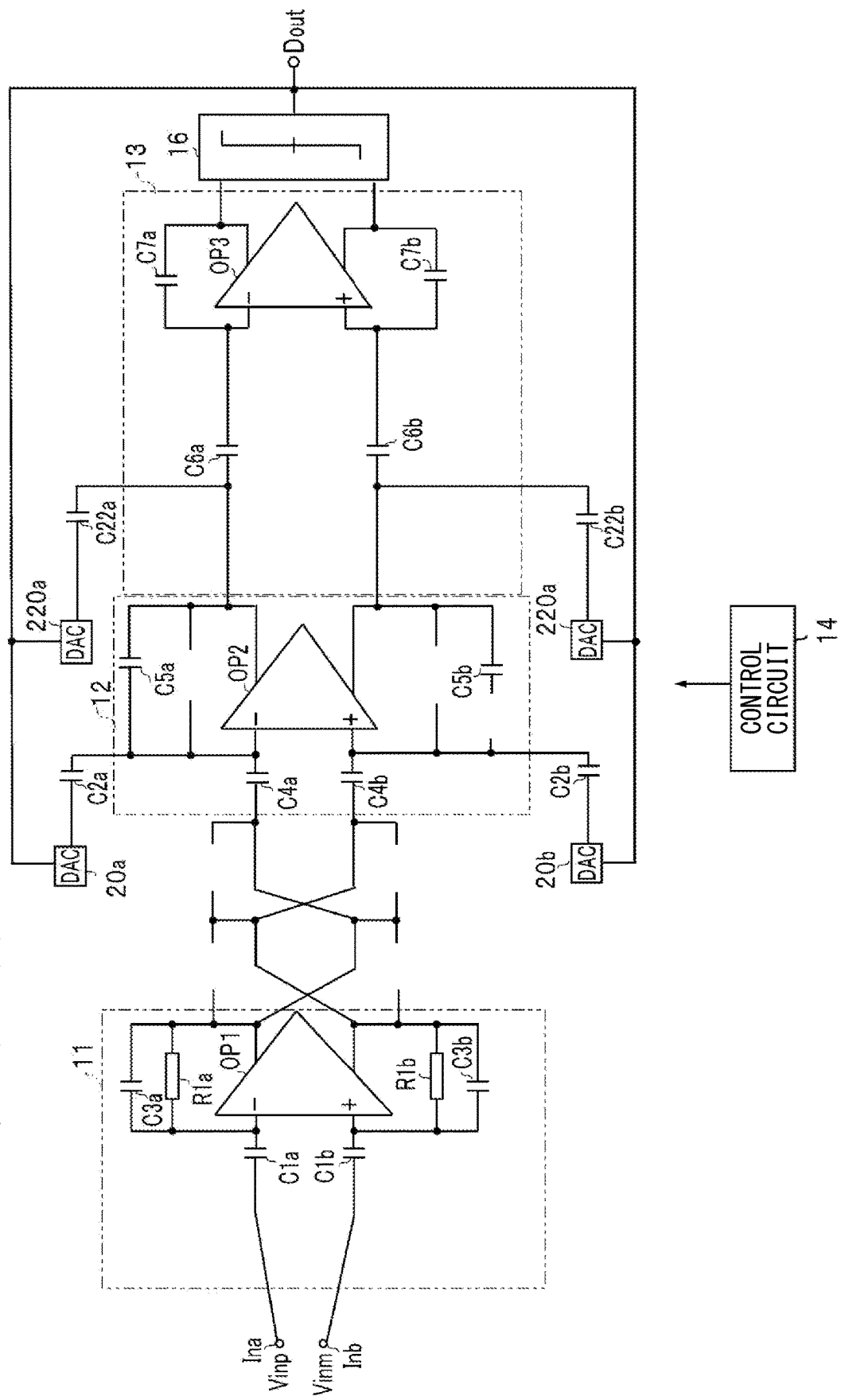
FIG. 6 illustrates a second electrical structure showing one of operation states in the first embodiment.

As illustrated in FIG. 6, when the control signals φ1, φ2, φ1d, and φ2d become the state of "φ1=OFF", "φ1d=OFF", "φ2=ON", "φ2d=ON", "φ1din=OFF", "φ1dout=OFF", "φ2din=ON", and "φ2dout=ON" at the timings t2 and t2d, the wiring connection shown in FIG. 6 is established. The straight connection is maintained between the output of the capacitively-coupled amplifier 11 and the input of the first integrator 12.

At this time, since the input voltage of the input capacitor C1 of the capacitively-coupled amplifier 11 changes, the charge corresponding to the voltage change is transferred to the capacitor C3, and the voltage at the output terminal of the capacitively-coupled amplifier 11 and the input voltage of the first integrator 12 also change. As the input voltage of the first integrator 12 changes, the output value of the capacitor C5 changes, and as a result, the change amount in the present time is added to the output value up to the previous time to be integrated and output.

On the other hand, since the switch S11 is turned on by the control signal of "φ2d=ON", the accumulated charges of the capacitor C5 is distributed to the capacitor C6. Further, since the switch S14 is turned on, the second integrator 13 provides the integrated output of the first integrator 12 and further executes integrated output, and accumulates charge in the capacitor C7 from the output of the operational amplifier OP3. A voltage integrated by the second integrator 13 is provided to the quantizer 16. The quantizer 16 generates a digital signal Dout based on the voltage integrated by the operational amplifier OP3.

The D/A converters 20a and 20b execute feedback of some potentials to the first integrator 12 based on the digital signal Dout, and the D/A converters 220a and 220b execute feedback of some potentials to the second integrator 13 based on the digital signal Dout. At this time, the first integrator 12 adds up the output of the D/A converter 20a and the output of the D/A converter 20b to output the integrated output, and the second integrator 13 adds up the output of the D/A converter 220a and the output of the D/A converter 220b to execute the integrated output.

Figure 7:
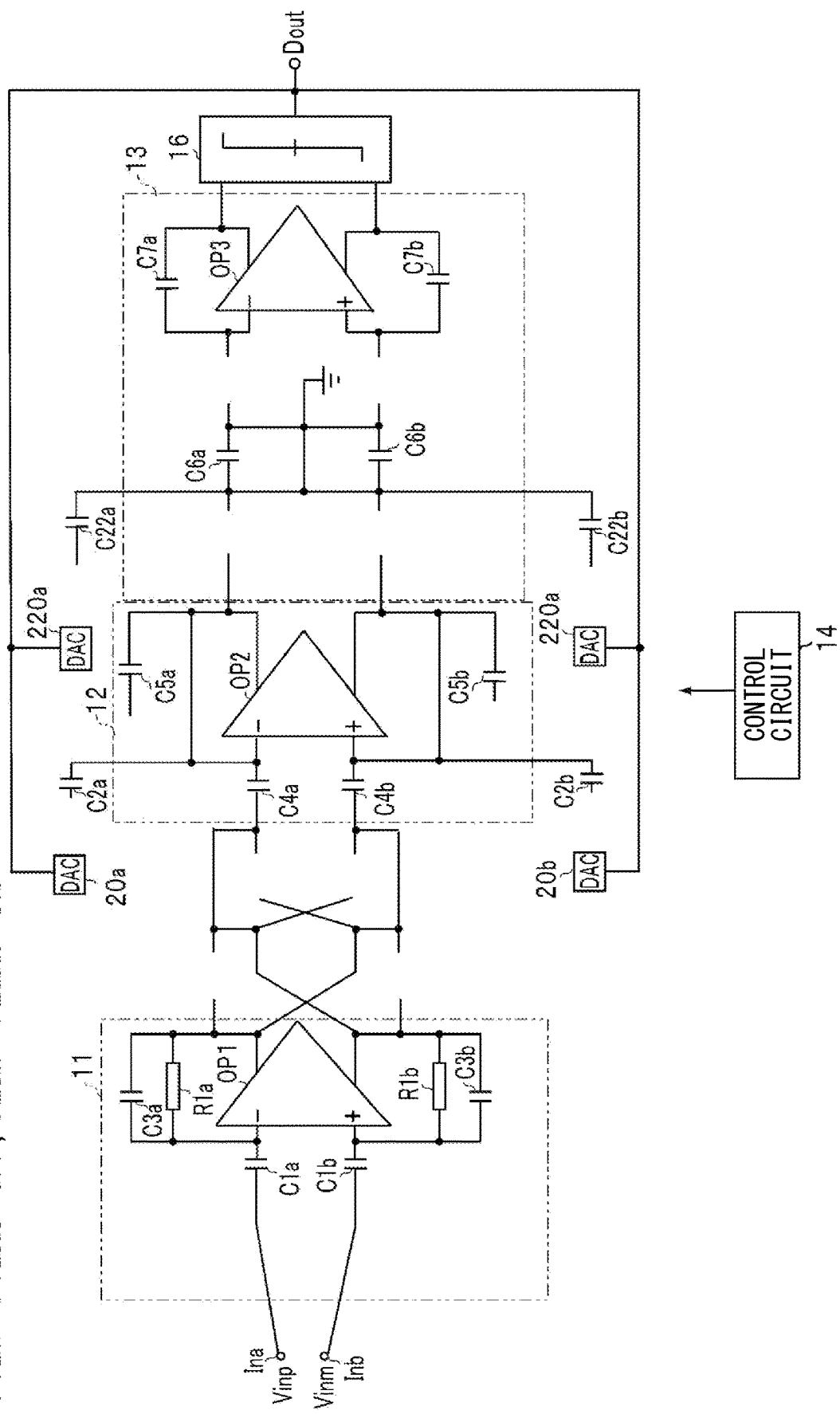
FIG. 7 illustrates a third electrical structure showing one of operation states in the first embodiment.

After that, when the control signals φ1, φ2, φ1d, and φ2d become the state of "φ1=ON", "φ1d=ON", "φ2=OFF", "φ2d=OFF", "φ1din=OFF", "φ1dout=OFF", "φ2din=ON", and "φ2dout=ON" at the timings t3 and t3d in FIG. 2C, the wiring connection shown in FIG. 7 is established.

At this time, the analog input signals Vinm, Vinp are provided to the capacitors C1b, C1a of the capacitively-coupled amplifier 11. After the capacitively-coupled amplifier 11 amplifies the input signal, the input signal is subsequently sampled by the capacitor C4 that functions as the sampling capacitance of the first integrator 12. Further, since the switch S10 is turned off, the charge of the capacitor C5 is maintained.

Figure 8:
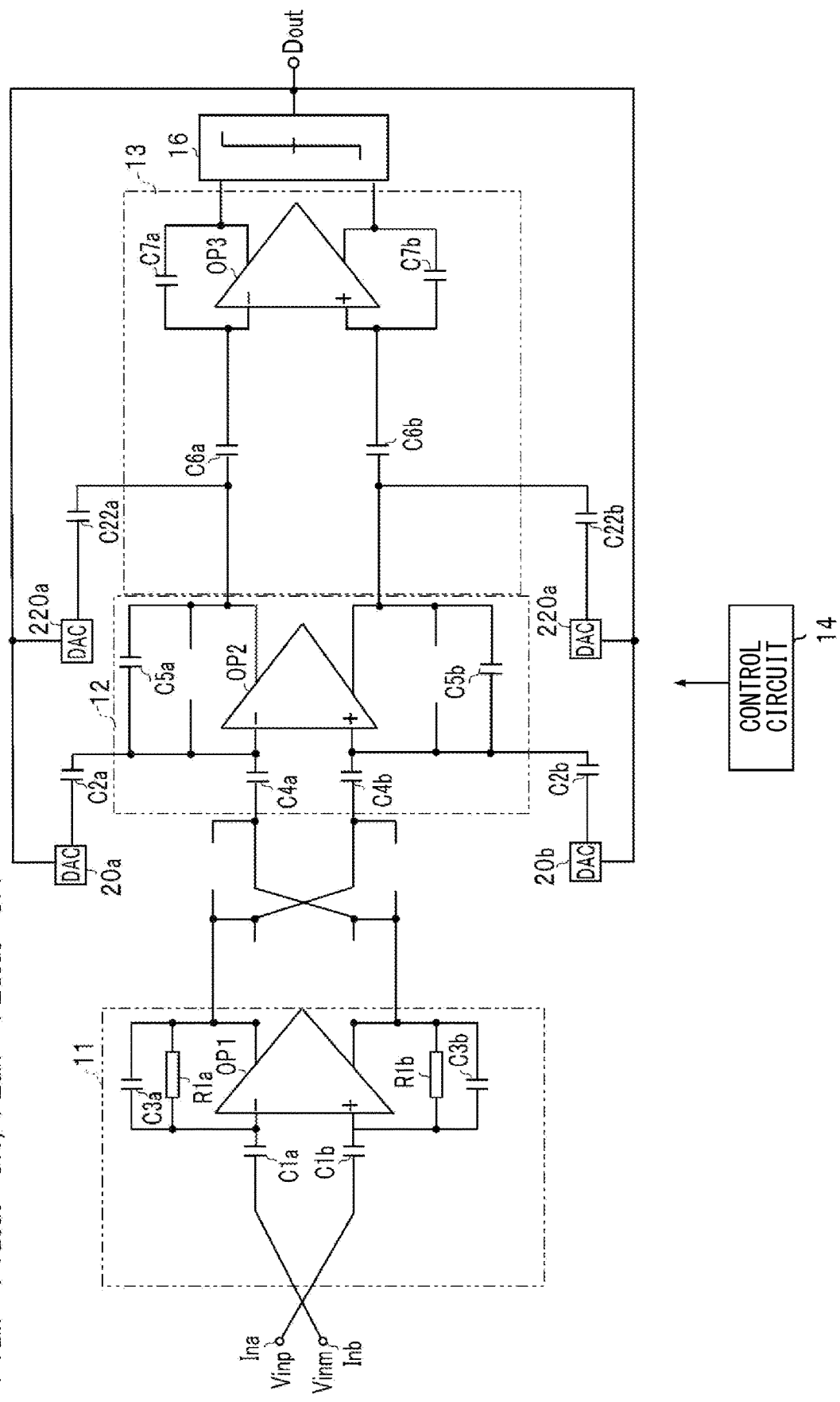
FIG. 8 illustrates a fourth electrical structure showing one of operation states in the first embodiment.

After that, when the control signals φ1, φ2, φ1d, and φ2d become the state of "φ1=OFF", "φ1d=OFF", "φ2=ON", "φ2d=ON", "φ1din=ON", "φ1dout=ON", "φ2din=OFF", and "φ2dout=OFF" at the timings t4 and t4d in FIG. 2C, the wiring connection shown in FIG. 8 is established. A cross connection is made between the output of the capacitively-coupled amplifier 11 and the input of the first integrator 12.

At this time, since the input voltage of the input capacitor C1 of the capacitively-coupled amplifier 11 changes, the charge corresponding to the voltage change is transferred to the capacitor C3, and each of the voltage at the output terminal of the capacitively-coupled amplifier 11 and the input voltage of the first integrator 12 changes.

The first integrator 12 adds a change in the present time to the output value of the previous time to execute the integrated output. On the other hand, since the switch S11 is turned on by the control signal of "φ2d=ON", the output voltage of the operational amplifier OP is provided to the capacitor C6. Further, since the switch S14 is turned on, the second integrator 13 provides the integrated output of the first integrator 12 and further integrates and outputs it, and accumulates charge in the capacitor C7 from the output of the operational amplifier OP3. A voltage integrated by the second integrator 13 is provided to the quantizer 16.

As described above, since the quantizer 16 periodically outputs the digital signal Dout, the D/A converters 20a, 20b, 220a, 220b can respectively output feedback to the first integrator 12 and the second integrator 13. Thereafter, the statuses illustrated in FIGS. 5 to 8 are repeated in order.

Technical Advantageous Effects in the Present Embodiment

According to the structure according to the first embodiment, although an offset occurs at the output of capacitively-coupled amplifier 11, the output is modulated by the chopping of the first switch SW1 and is demodulated by the chopping of the second switch SW2. In addition, the demodulated output signal of the capacitively-coupled amplifier 11 is taken into the first integrator 12 through the third switch SW3.

Therefore, since the output signal repeats variation between positive and negative, the DC value converges to an average value, and the influence of the offset can be prevented from appearing in the final output. As a result, even though the first integrator 12 has an error with respect to an error depending on the input voltage, the error does not affect the first integrator 12. Therefore, it is possible to reduce the influence of the offset for the entire circuit.

By lowering the frequency Fs/2 of the chopping operation of the switches SW1 and SW2 respectively provided before and after the capacitively-coupled amplifier 11 than the reference frequency Fs of the chopping operation of the first integrator 12 and the second integrator 13, it is possible to reduce the driving frequency of the switches SW1 and SW2. An anti-aliasing filter FA shown in each of FIGS. 3A, 3B may be provided before the input terminals Ina and Inb. The anti-aliasing filter FA includes an RC low-pass filter including a resistor Ra and a capacitor CA.

In the structure such as the one shown in FIG. 3, if the driving frequency of the switches SW1 and SW2 can be lowered, the amount of current flowing through the resistor RA included in the anti-aliasing filter FA decreases. Therefore, it is possible to reduce the detection error due to a voltage drop through the resistor RA. According to the present embodiment, since the respective phases of the control signals φ1 din and φ1dout are identical and the respective phases of the control signals φ2din and φ2dout are identical, the control signals φ1 din, φ1dout, φ2din and φ2dout are easily produced.

Second Embodiment

Figure 9:
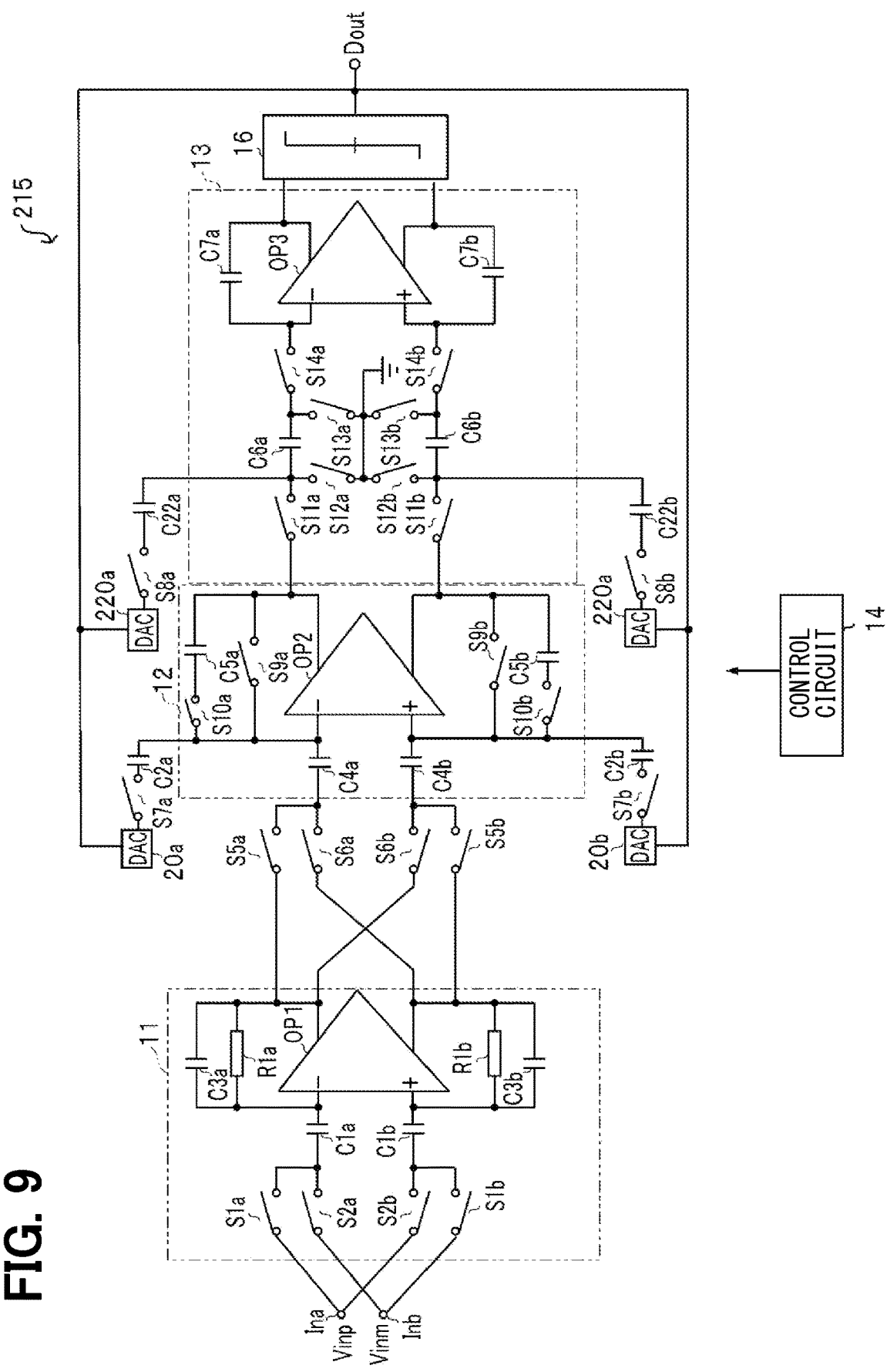
FIG. 9 illustrates an electrical structure of a delta-sigma modulator according to a second embodiment.

The following describes a second embodiment with references to FIGS. 9 to 16. Hereinafter, differences from the first embodiment will be described. FIG. 9 illustrates an example of a circuitry structure according to the second embodiment without the switches S3a, S3b, S4a, and S4b and with the modification of wiring connection being different from the circuitry structure according to the first embodiment, in other words, FIG. 1.

In the circuitry structure in FIG. 9, the respective functions of the switches S3a and S5a illustrated in FIG. 1 are integrated into the switch S5a, and the respective functions of the switches S3b and S5b are integrated into the switch S5b. In addition, the respective functions of the switches S4b and S6a illustrated in FIG. 1 are integrated into the switch S6a, and the respective functions of the switches S4a and the S6b are integrated into the switch S6b.

Figure 10:
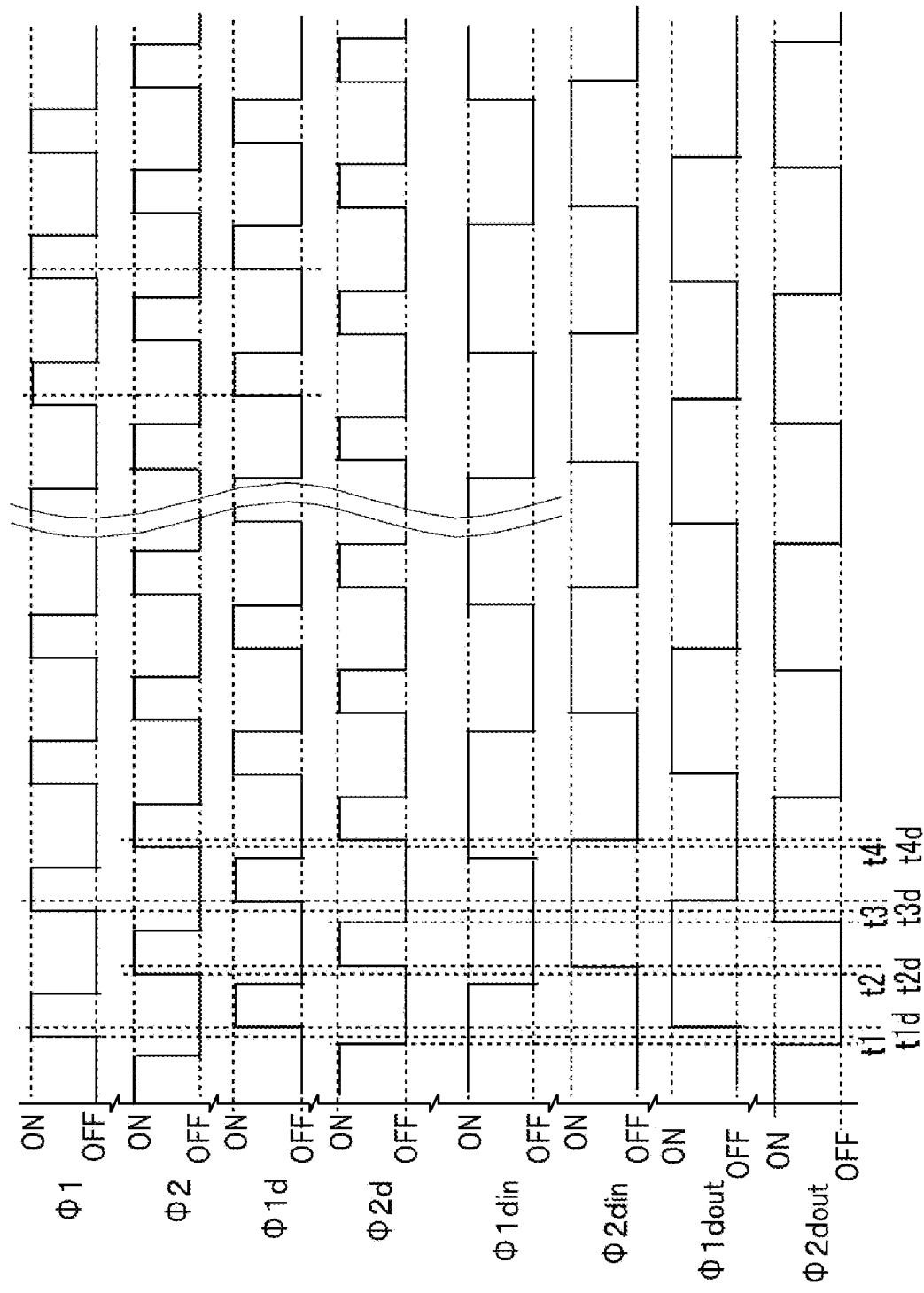
FIG. 10 illustrates a timing chart schematically showing a signal change in each device in the second embodiment.
Figure 11:
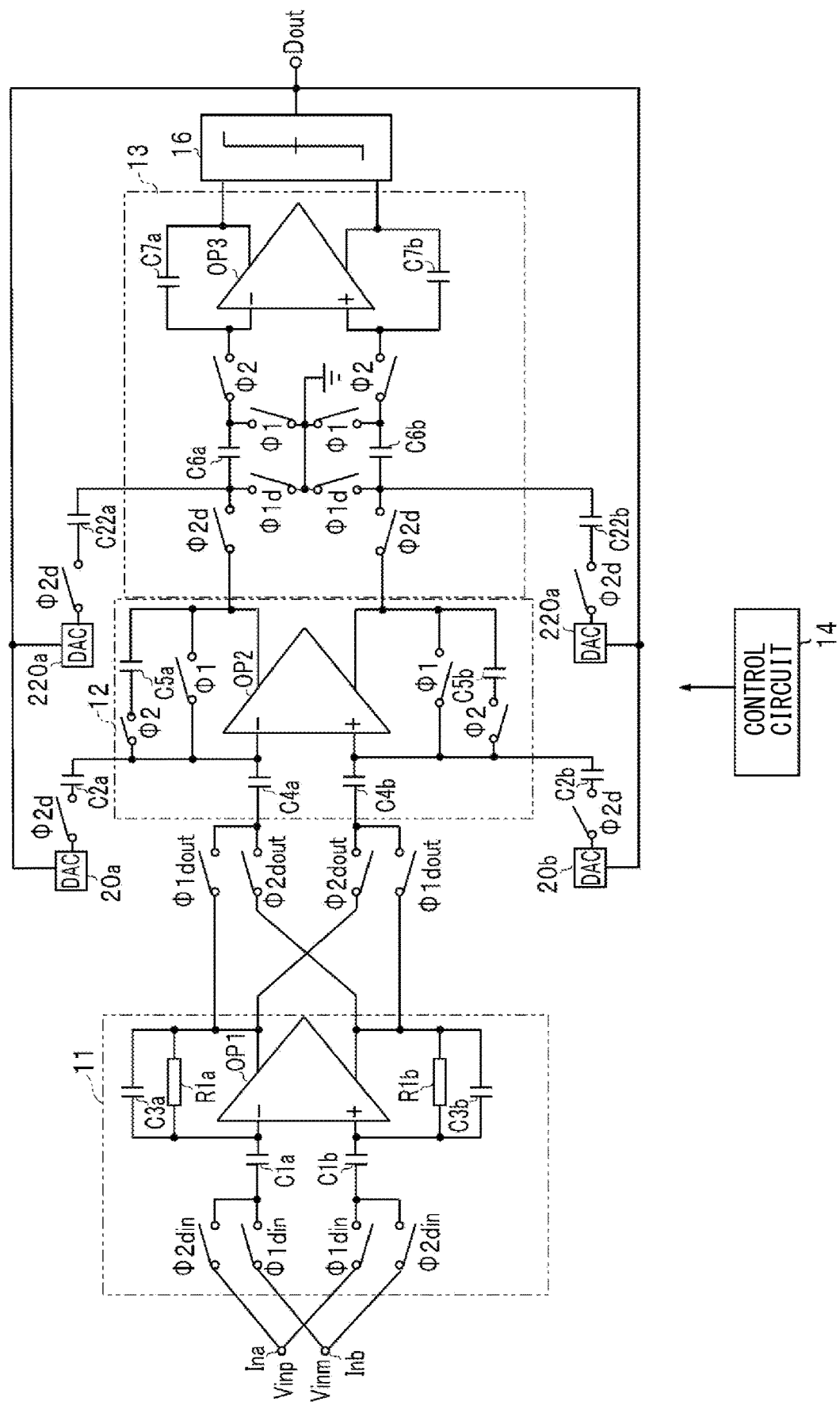
FIG. 11 is a correspondence diagram of control signals provided to switches in the second embodiment.
Figure 12A:
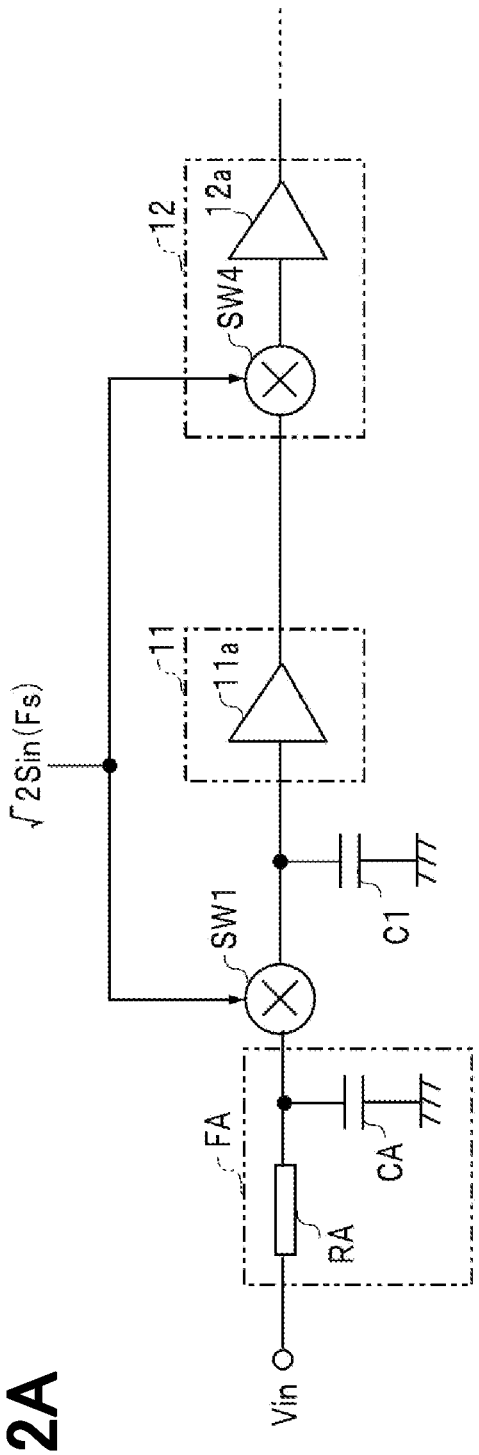
FIG. 12A illustrates a delta-sigma modulator in a comparative example.
Figure 12B:
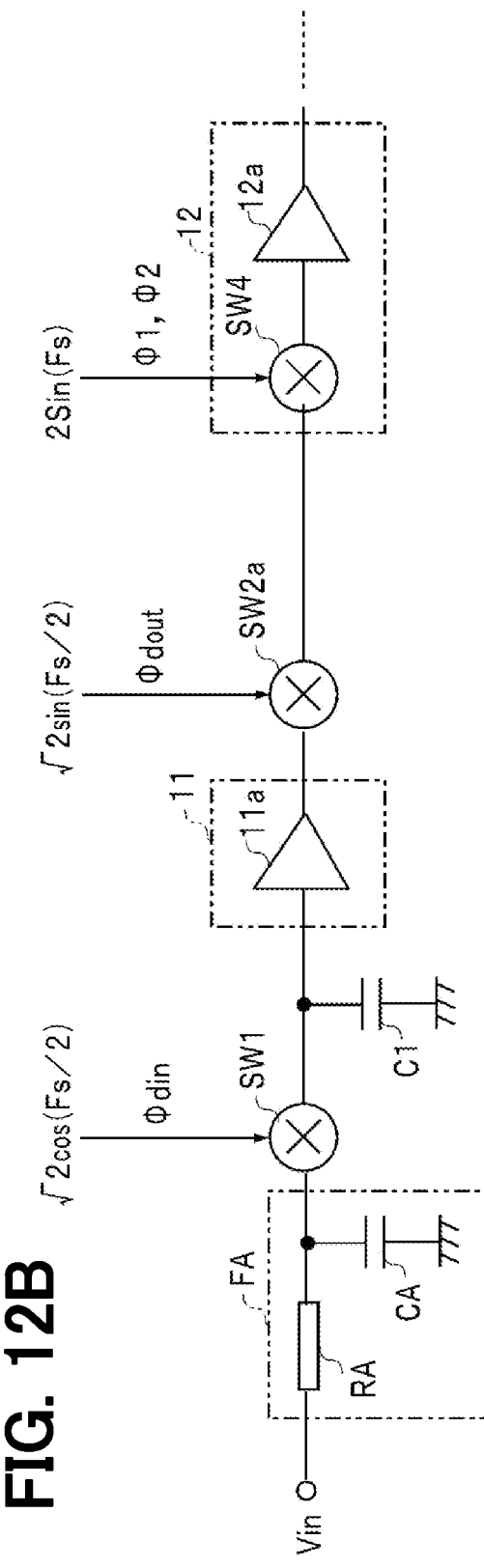
FIG. 12B illustrates a delta-sigma modulator in the second embodiment.

In the present embodiment, the wiring connection of each configuration element is modified as illustrated in FIG. 9 and the control signal of each switch in FIG. 9 is modified as illustrated in FIG. 10. It is possible to change the wiring sequentially as illustrated in FIGS. 13 to 16 by applying the modified control signal to each switch as illustrated in FIG. 11. Each of FIG. 12A, 12B illustrates a block diagram corresponding to each of FIGS. 3A, 3B related to the first embodiment.

Figure 13:
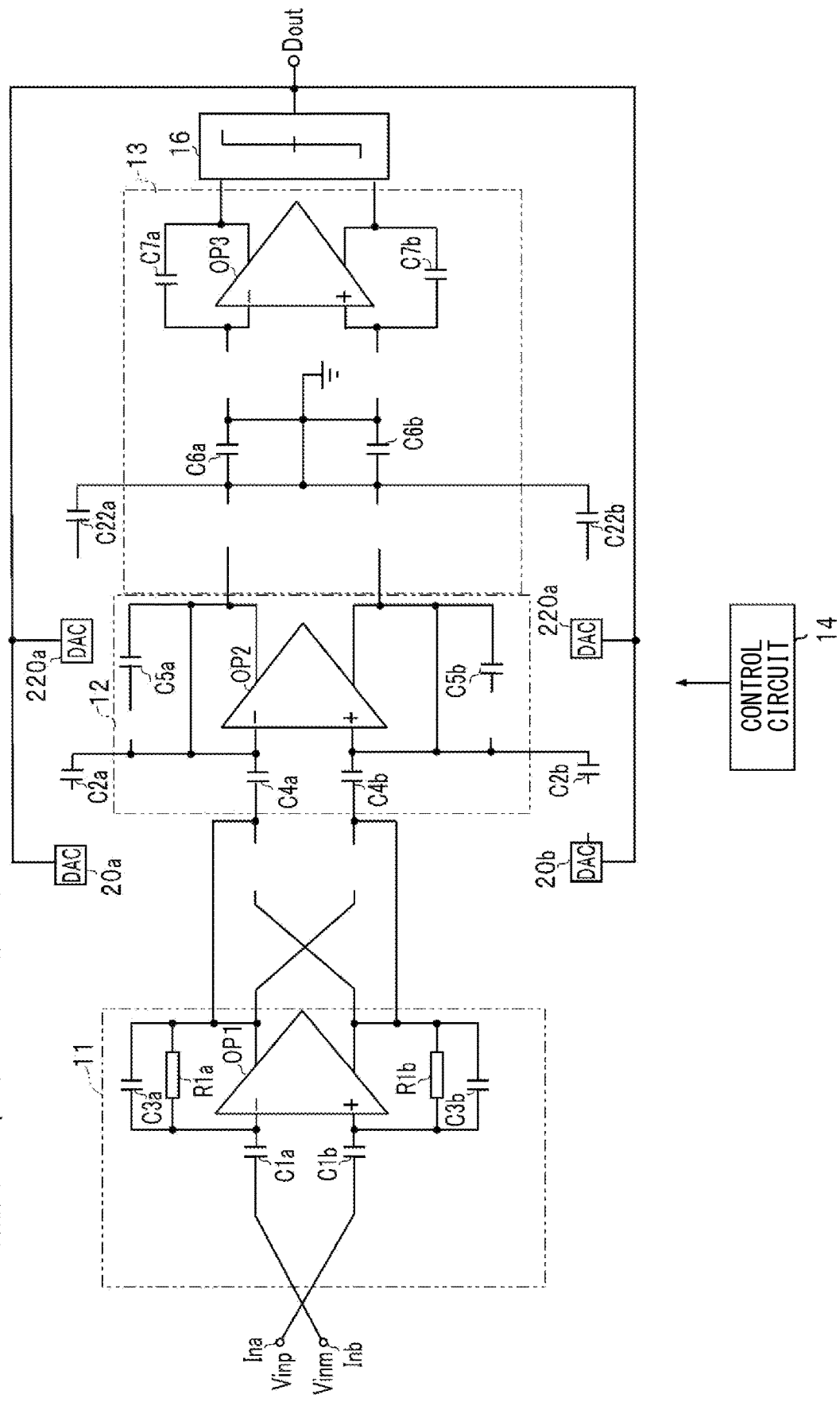
FIG. 13 illustrates a first electrical structure showing one of operation states in the second embodiment.
Figure 14:
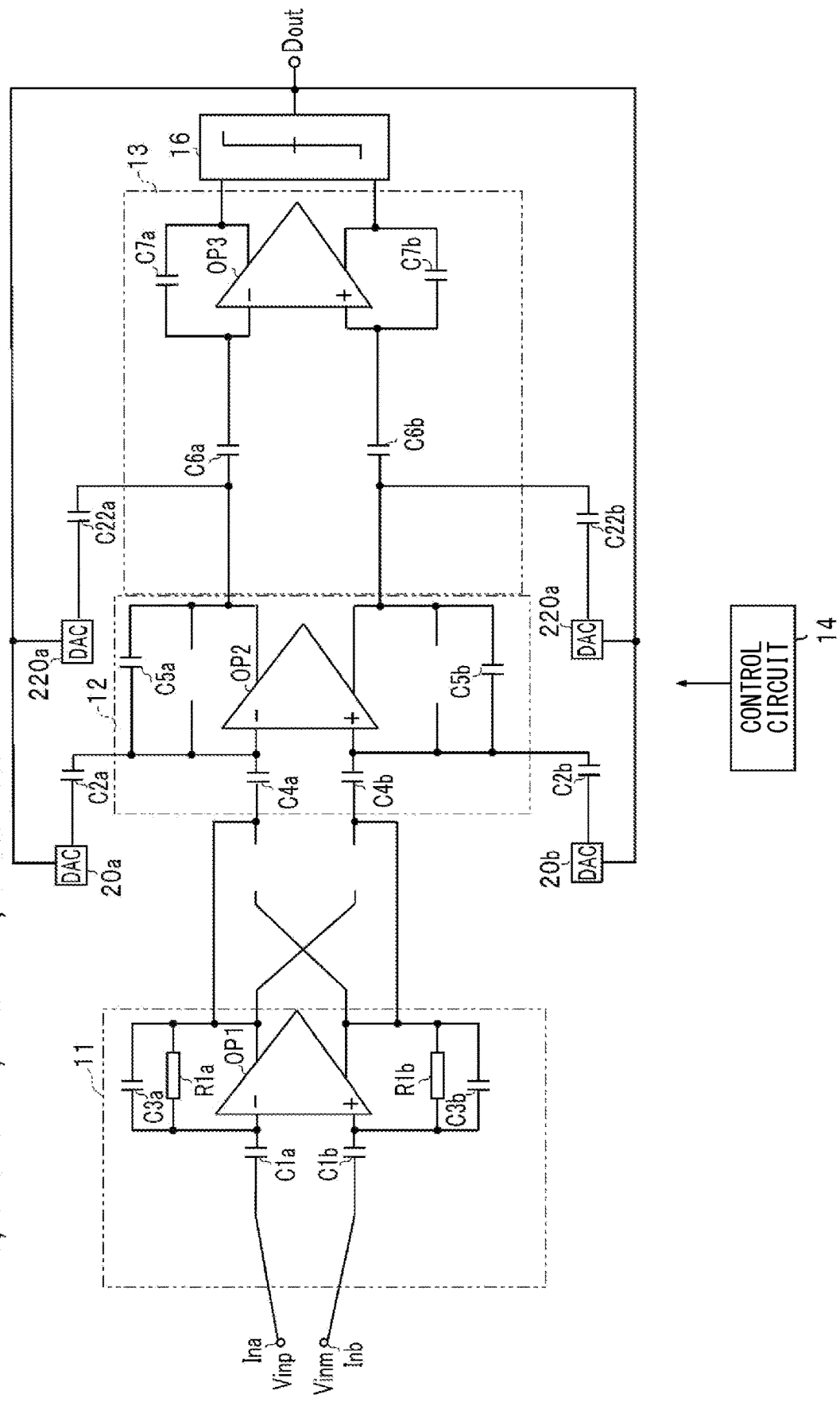
FIG. 14 illustrates a second electrical structure showing one of operation states in the second embodiment.
Figure 15:
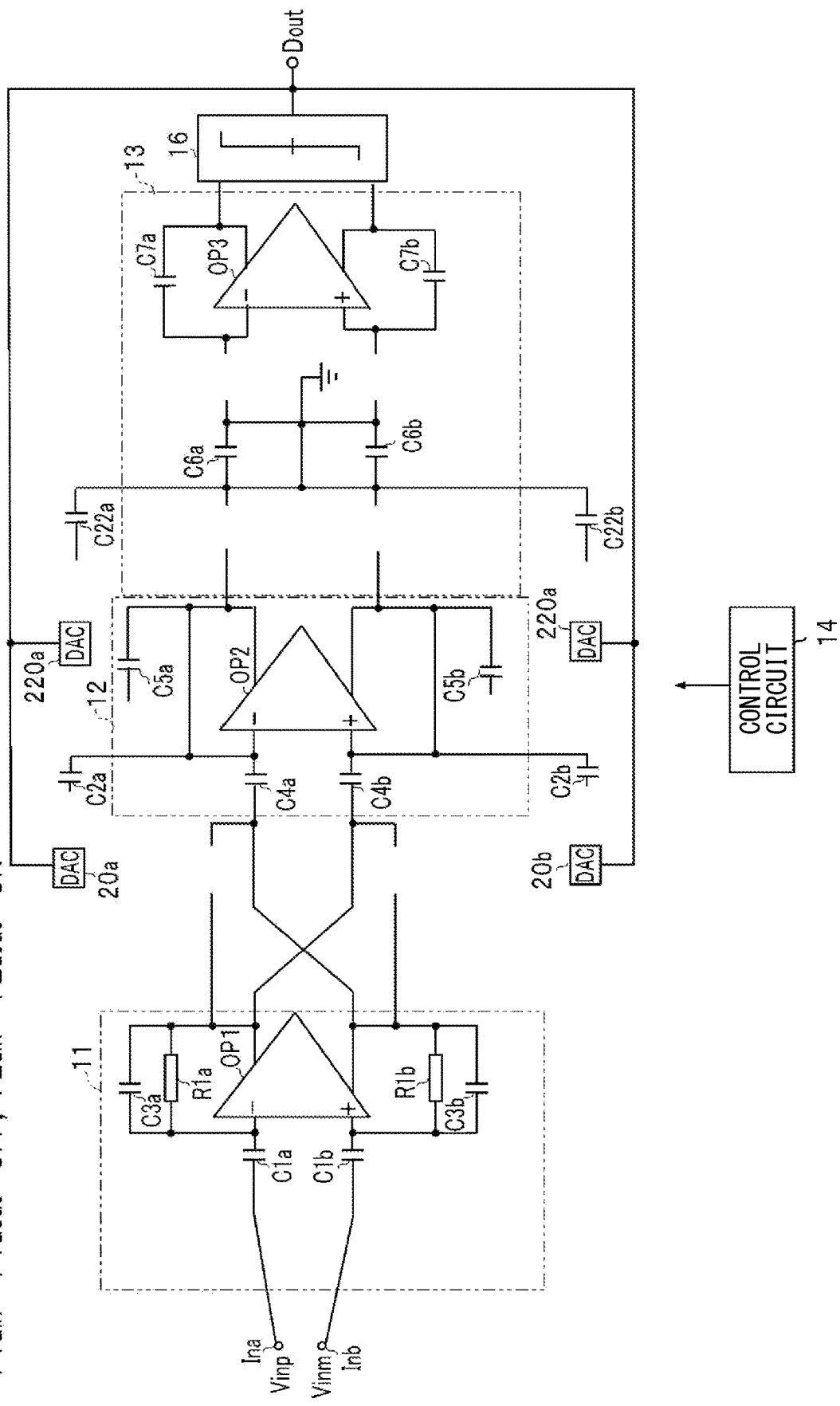
FIG. 15 illustrates a third electrical structure showing one of operation states in the second embodiment.
Figure 16:
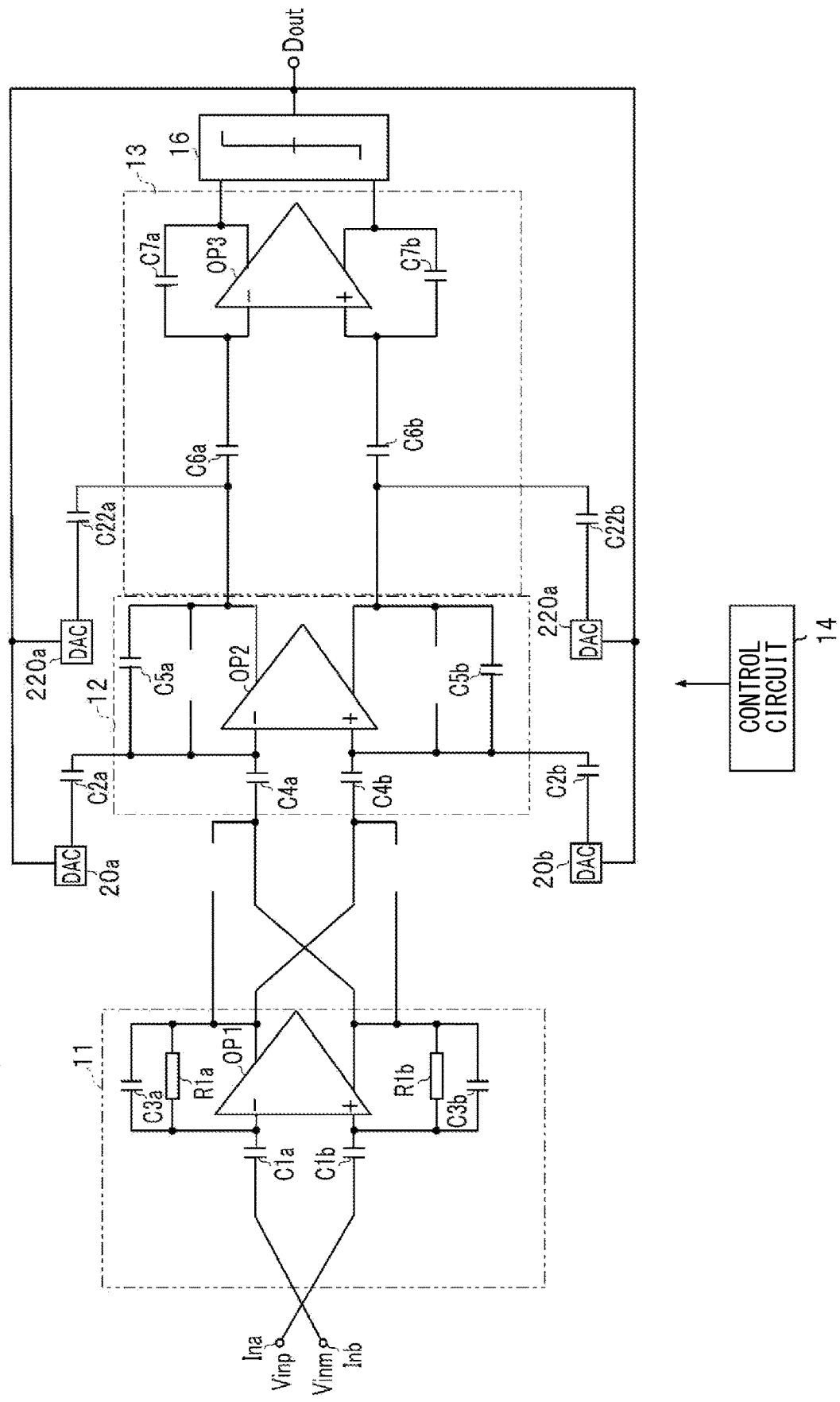
FIG. 16 illustrates a fourth electrical structure showing one of operation states in the second embodiment.
Figure 17:
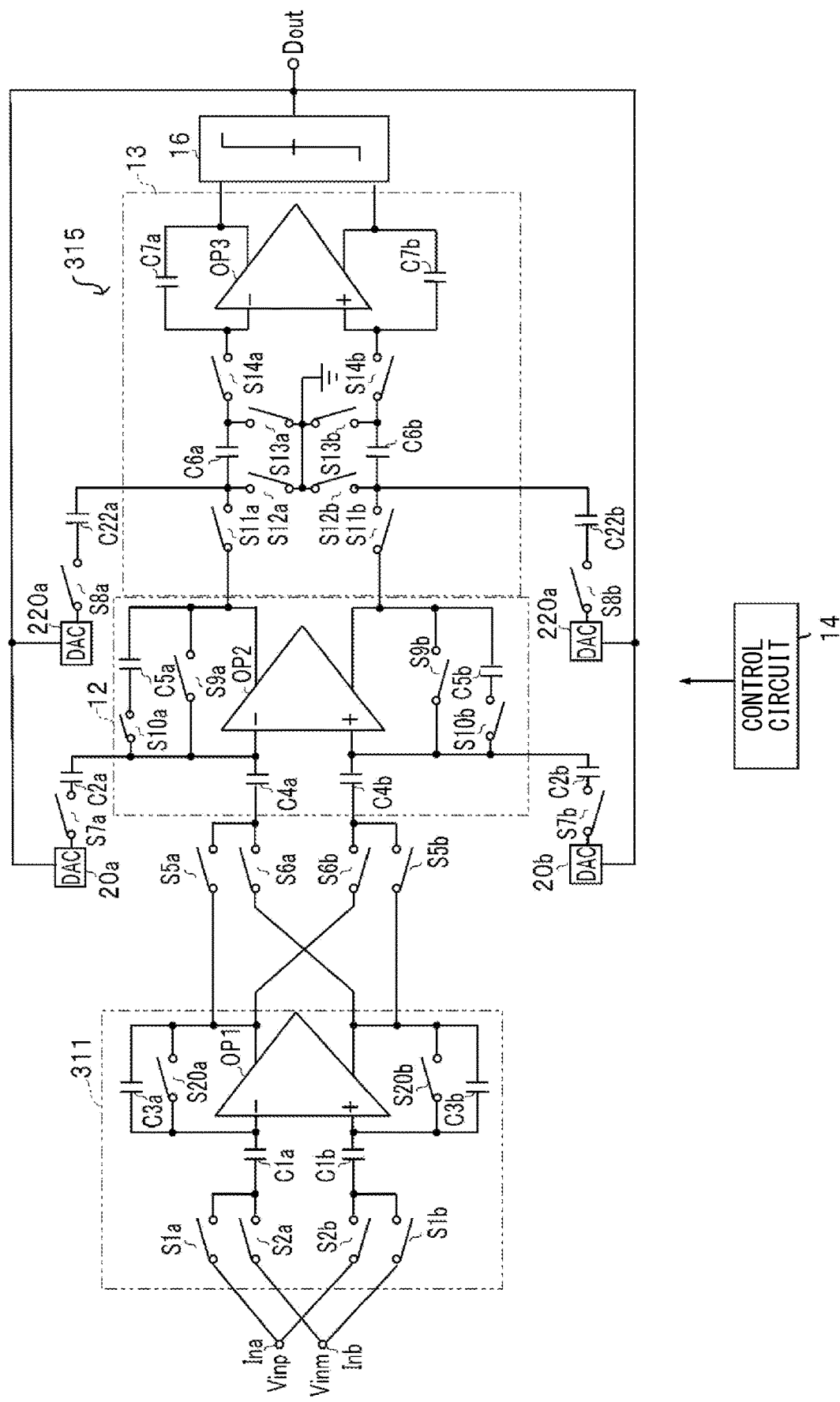
FIG. 17 illustrates an electrical structure of a delta-sigma modulator according to a third embodiment.

When the wiring connection of the circuit is switched as illustrated in FIG. 13 related to the present embodiment, the circuit becomes identical to the circuit illustrated in FIG. 5 related to the first embodiment. When the wiring connection of the circuit is switched as illustrated in FIG. 14 related to the present embodiment, the circuit becomes identical to the circuit illustrated in FIG. 6 related to the first embodiment. When the wiring connection of the circuit is switched as illustrated in FIG. 15 related to the present embodiment, the circuit becomes identical to the circuit illustrated in FIG. 7 related to the first embodiment. When the wiring connection of the circuit is switched as illustrated in FIG. 16 related to the present embodiment, the circuit becomes identical to the circuit illustrated in FIG. 8 related to the first embodiment. Since the wiring connection in the circuit according to the second embodiment can be switched to the same wiring in the circuit according to the first embodiment, detailed description of the operation is omitted.

As illustrated in FIG. 12, in the present embodiment, the first switch SW1 having the switches S1, S2 is under the chopping operation at the frequency Fs/2 being a half of the reference frequency Fs, and the second switch SW2a having the switches S5, S6 is under the chopping operation at the frequency Fs/2 being a half of the reference frequency Fs. The second switch SW2a is operated at a timing that is 90 degrees out of phase with respect to the driving timing of the first switch SW1. Also in the present embodiment, the same effect as the first embodiment is achieved.

According to the structure illustrated in FIG. 9 related to the present embodiment, the respective functions of the switches S3a, S5a illustrated in FIG. 1 can be integrated into one switch S5a, and the respective functions of the switches S3b, S5b illustrated in FIG. 1 can be integrated into one switch S5b. In addition, the respective functions of the switches S4b, S6a illustrated in FIG. 1 are integrated into the switch S6a, and the respective functions of the switches S4a, S6b illustrated in FIG. 1 are integrated into the switch S6b. Therefore, in the present embodiment, as illustrated in FIG. 12, the first integrator 12 can acquire the demodulated output signal of the capacitively-coupled amplifier 11 by switching the second switch SW2a having the switches S5, S6.

Therefore, in the present embodiment, the switches S3a, S3b, S4a, and S4b can be eliminated as compared to the first embodiment. The switches S3a, S3b, S4a, and S4b described in the first embodiment respectively adopt the MOS transistors. Therefore, an error factor may occur due to the on-resistance when the MOS transistors are turned on. Since the switches S3a, S3b, S4a, and S4b can be eliminated in the present embodiment, it is possible to optimally suppress the influence of change in on-resistance of the MOS transistors.

Third Embodiment

The following describes a third embodiment with references to FIGS. 17 to 21. In the preceding embodiment, the feedback resistors R1a, R1b are respectively connected to the input and output of the operational amplifier OP1 included in the capacitively-coupled amplifier 11 to determine an input DC potential of the operational amplifier OP1. In the present embodiment, the resistors R1a, R1b are replaced by the switches S20a, S20b. In the present embodiment, a capacitively-coupled amplifier 311 of a delta-sigma modulator 315 is constructed by respectively connecting the switches S20a, S20b to the input and output of the operational amplifier OP1. The switches S20a, S20b are provided as a fifth switch for short-circuiting the input and output of the operational amplifier OP1 included in the capacitively-coupled amplifier 11 in order to perform DC bias of the input of the operational amplifier OP1.

Figure 18:
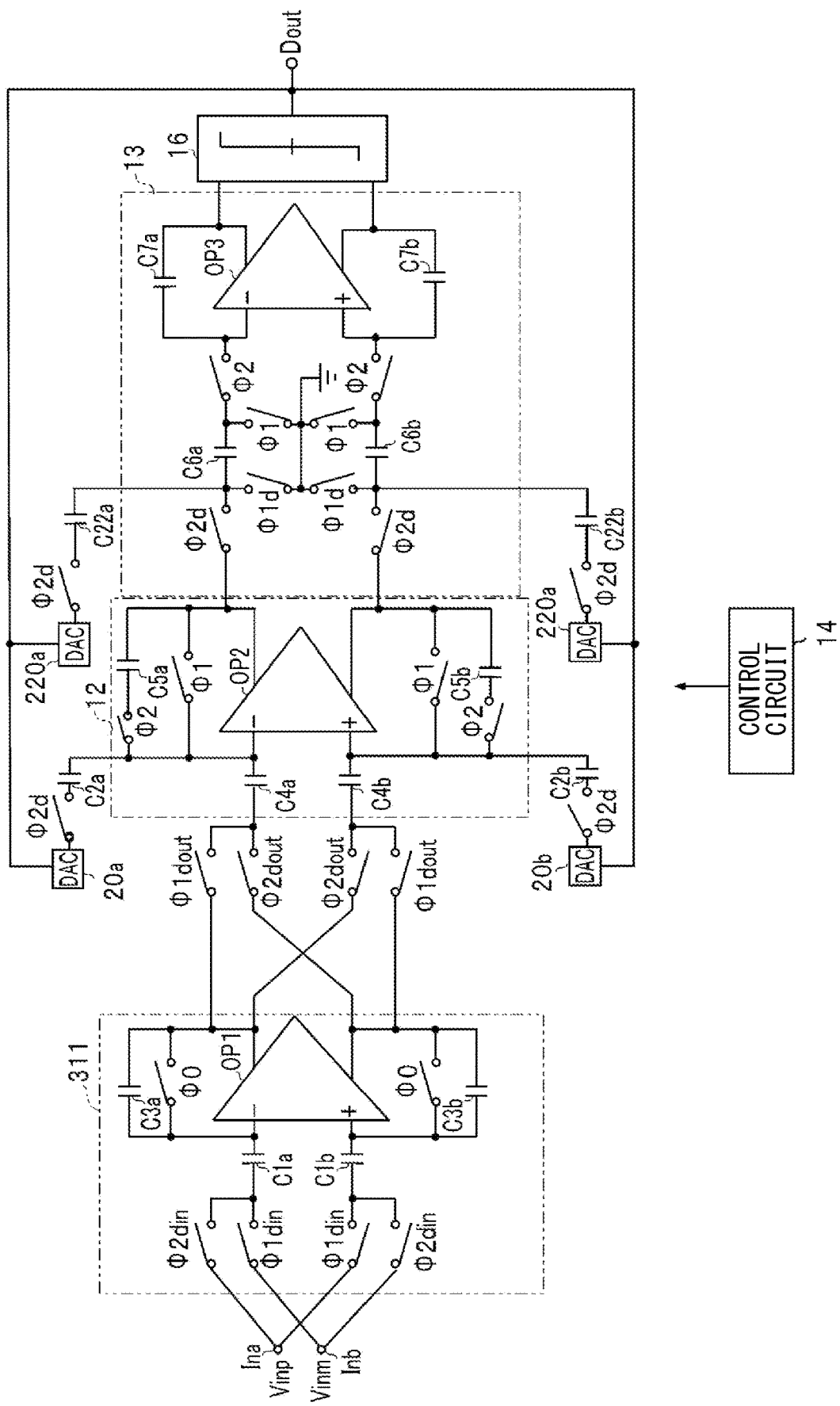
FIG. 18 is a correspondence diagram of control signals respectively provided to switches in the third embodiment.

As illustrated in FIG. 18, the control circuit 14 turns on and off the switch S20 through the control signal $\phi 0$. The control signal $\phi 0$ is generated by the clock generator 26 for resetting the capacitively-coupled amplifier as shown in FIG. 2A described in the first embodiment. The clock generator 26 receives the input of the original signal T1, T2, T3 and T4 generated by the on/off edge generator 24 and the control signal $\phi 13\_2$. The rising edge of the control signal $\phi 0$ is defined by the rising edge of the control signal $\phi 1d$, and the turn-on time is set to 50% or less of the turn-on time of the control signal $\phi 1d$.

As illustrated in FIG. 2B, the clock generator 26 generates the control signal $\phi 0$ that rises at the falling edge of the control signal $\phi 2d$ and that falls at the falling edge of the control signal $\phi 13\_2$. At this time, the clock generator 26 generates an edge at the off-state of the control signal $\phi 0$ after generating the falling edge of the control signal $\phi 13\_2$ from the rising edge of the master clock $\phi 12$ that has twice of the frequency of the control signal $\phi 1$. As a result, the clock generator 26 can generate the falling edge of the control signal $\phi 0$ from the falling edge of the control signal $\phi 13\_2$. Therefore, it is possible to shorten the turn-on period of the control signal $\phi 0$.

At this time, the clock generator 26 may raise the clock signal at the edge of the original signal T2 and then lower the clock signal at the edge of the control signal $\phi 13\_2$. The turn-on period of the control signal $\phi 0$ can also be shortened as much as possible. The edge at the off-state of the control signal $\phi 0$ can be generated from the edge at the on-state of the master clock $\phi 12$.

As a result, the control circuit 14 generates the control signal $\phi 0$ that turns on the switch S20 in a turn-on period during which the control signal $\phi 1$ is at the on-state or a predetermined time shorter than the turn-on period, and drives the switch S20 through the control signal $\phi 0$.

Figure 19:
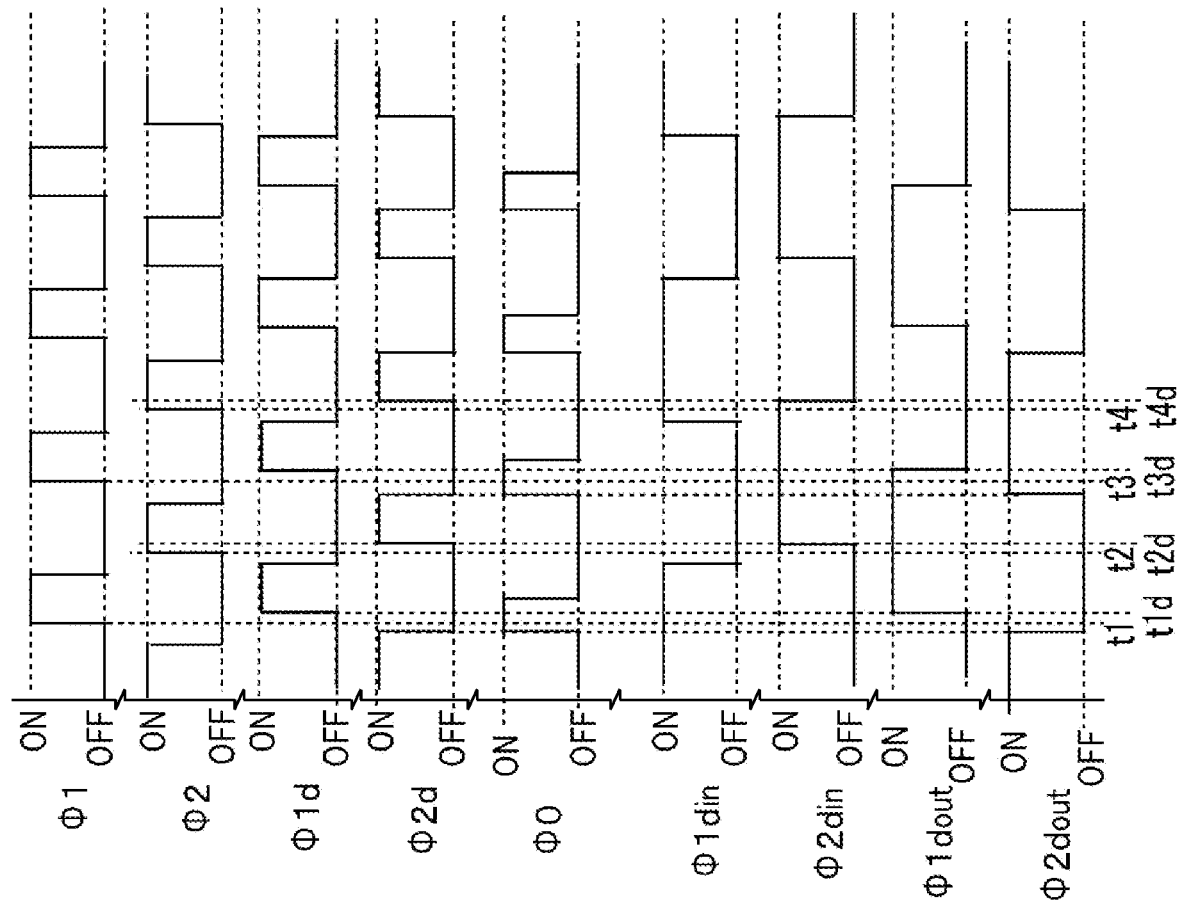
FIG. 19 illustrates a timing chart schematically showing a signal change in each device in the third embodiment.

FIG. 19 illustrates waveform examples of the control signals $\phi 1din$, $\phi 1dout$, $\phi 2din$, and $\phi 2dout$ respectively generated from the control signals $\phi 1$, $\phi 1d$, $\phi 2$, and $\phi 2d$. The clock generator 26 can generate the control signal $\phi 0$ that falls during the period in which, for example, the switches S2a, S2b, S5a and S5b are switched on by the control signals $\phi 1din$, $\phi 1dout$, and the output of the operational amplifier can execute feedback to the input during this period.

Figure 20:
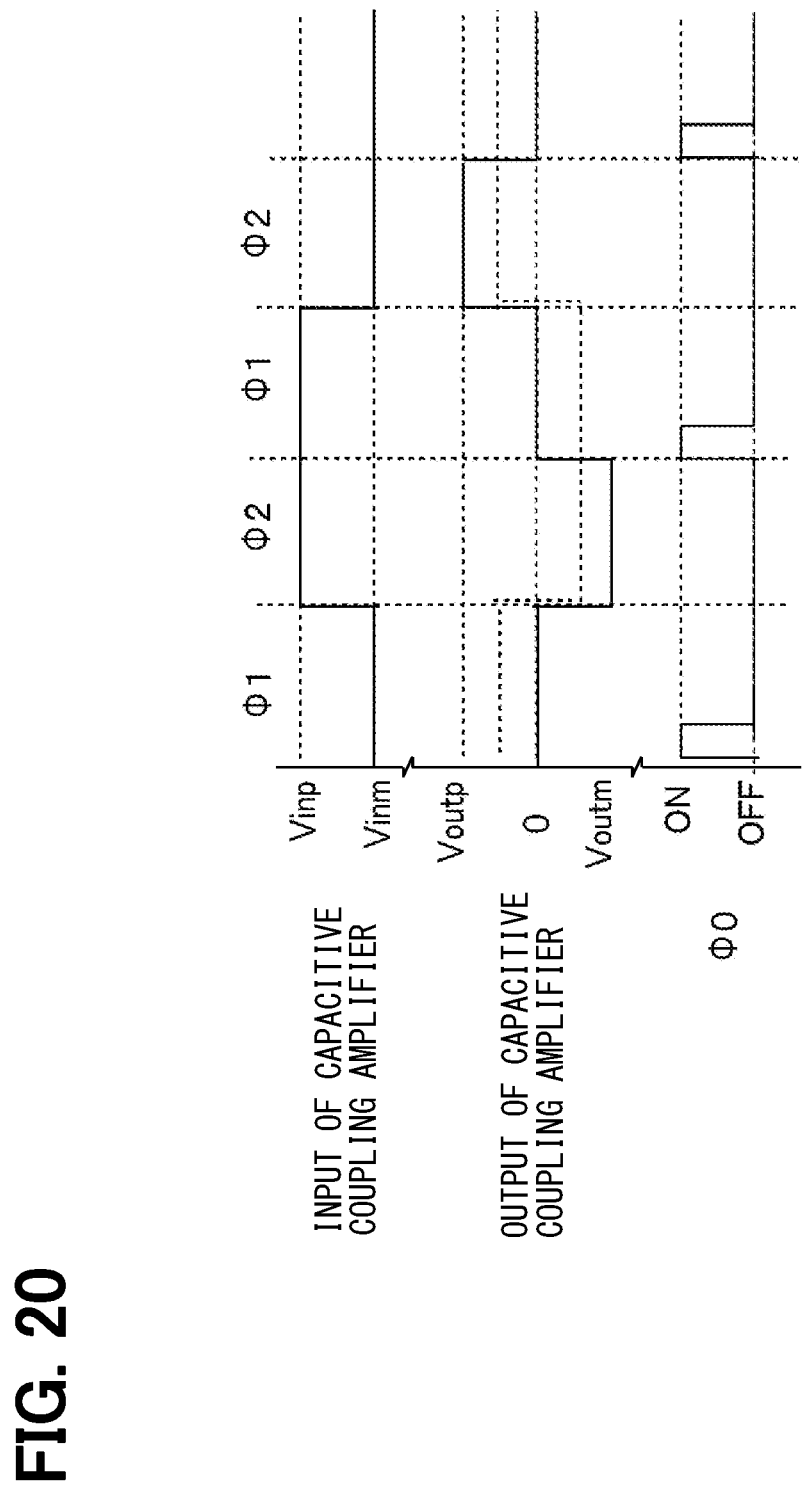
FIG. 20 is an example of a change in an input/output voltage corresponding to a change in an on/off state of an input/output switch of a capacitively-coupled amplifier in the third embodiment.

FIG. 20 schematically illustrates a change in the voltage at each of the input nodes and output nodes of the capacitively-coupled amplifiers 11, 311. A broken line in FIG. 20 indicates a voltage change in a situation of adopting the resistor R1 as in the preceding embodiment, and a solid line in FIG. 20 indicates a voltage change in a situation of adopting the switch S20 as in the present embodiment.

In a situation of adopting the switch S20, a resistive element having a high resistance is not required as compared with a situation of adopting the resistor R1. Since it is not necessary to conduct a DC current, it is possible to prevent the generation of a gain error caused by the flow of the DC current. Furthermore, it is possible to shorten the energization time of a DC bias, in other words, the turn-on time of the control signal $\phi 0$.

The present embodiment describes the structure of the delta-sigma modulator 315 in which the switch S20 is added to the delta-sigma modulator 215 according to the second embodiment. However, the present embodiment may adopt the switches S20a, S20b in replacement of the resistors R1a, R1b of the delta-sigma modulator 15 according to the first embodiment.

Fourth Embodiment

The following describes a fourth embodiment with references to FIGS. 21 to 25. A delta-sigma modulator 415 shown in FIG. 15 has polarity inversion circuits X1 (X1a, X1b), X2 (X2a, X2b), X3 (X3a, X3b) for chopping before and after input/output. In addition, an inversion circuit X4 with a control terminal is provided.

Figure 22:
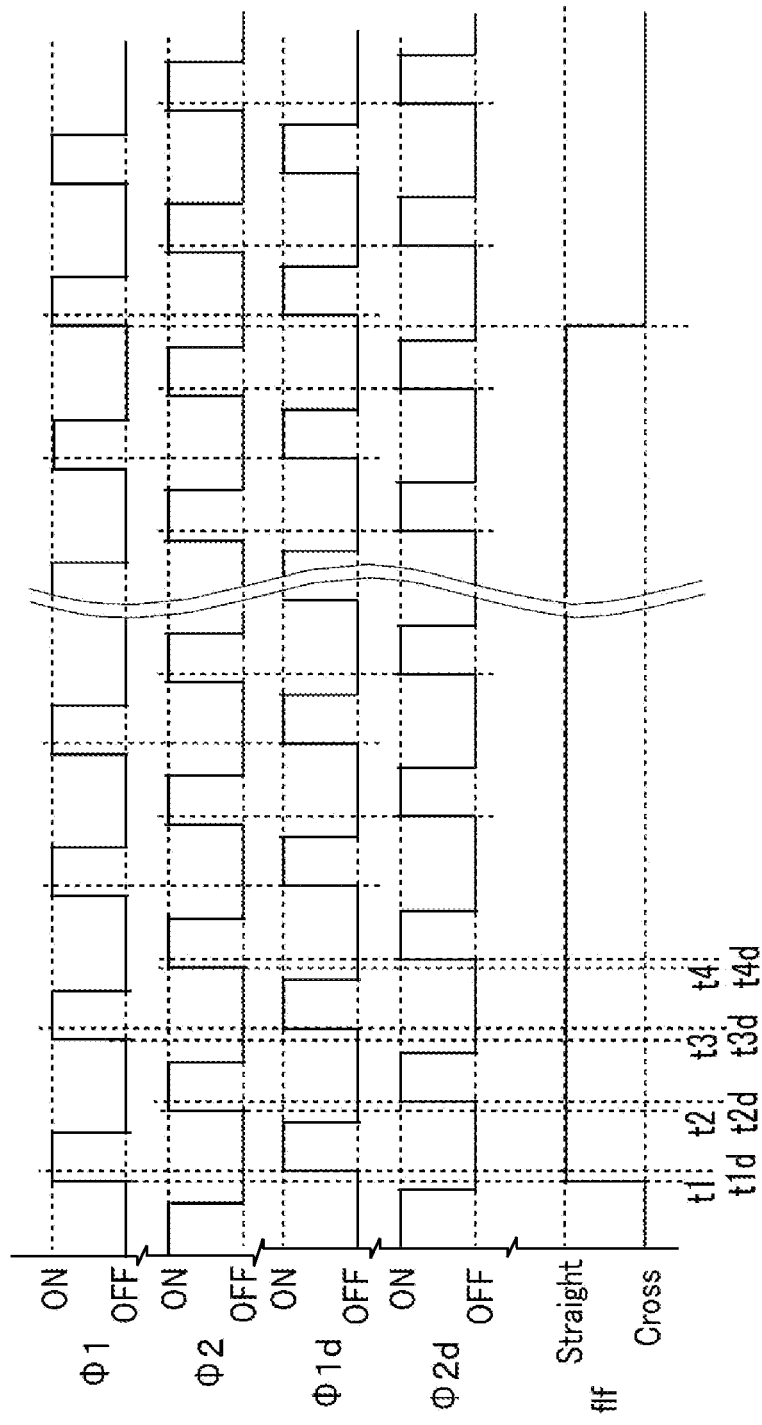
FIG. 22 illustrates a timing chart schematically showing a signal change in each device in the fourth embodiment.

The control circuit 14 switches the straight/cross connection of the polarity inversion circuits X1 to X3 by changing the polarity inversion signal flf as shown in FIG. 22, and controls the polarity inversion by switching the normal output and the inversion output of the inversion circuit X4.

Figure 21:
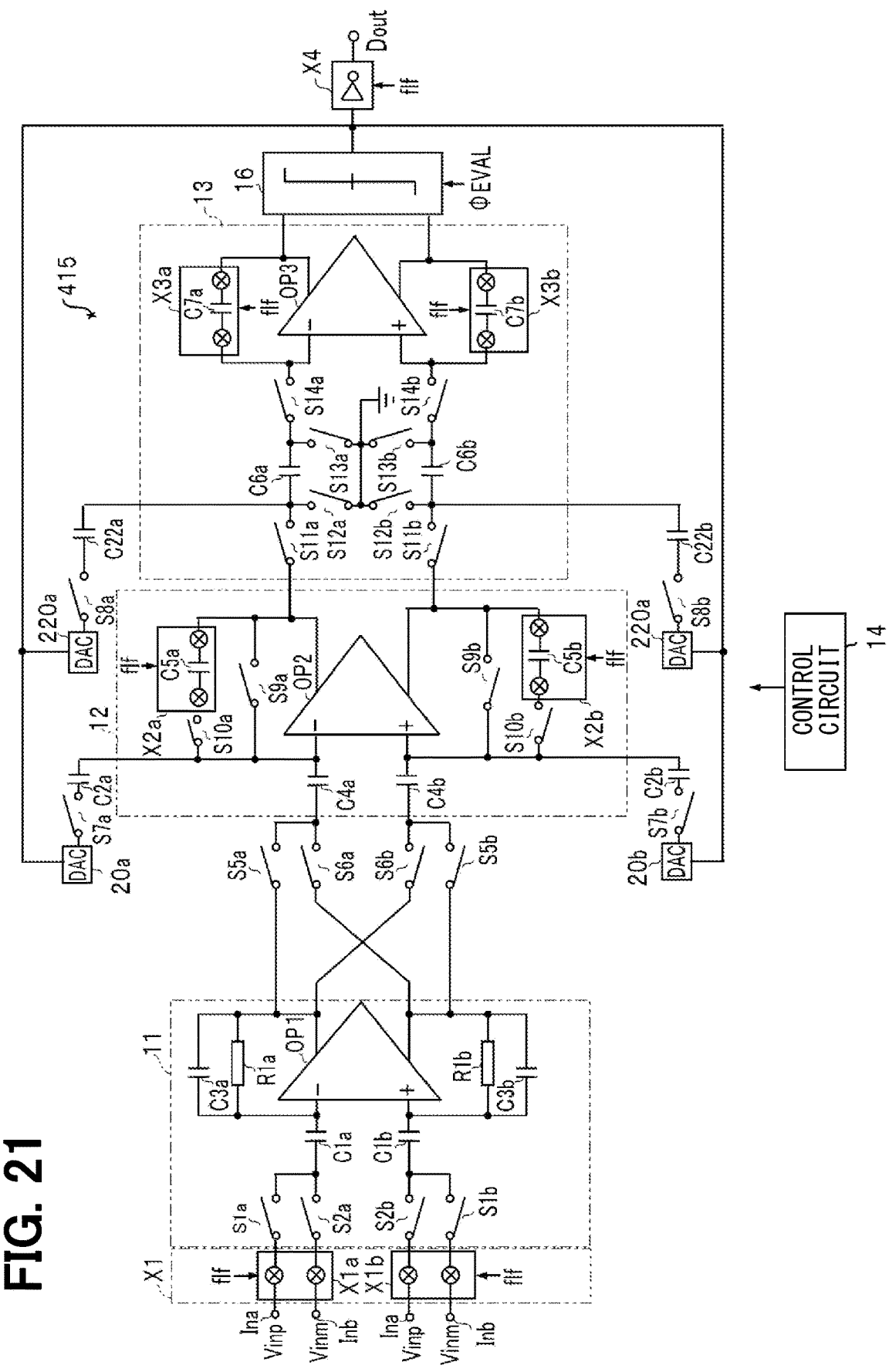
FIG. 21 illustrates an electrical structure of a delta-sigma modulator according to a fourth embodiment.

The polarity inversion circuits X1 (X1a, X1b), X2 (X2a, X2b), X3 (X3a, X3b) shown in FIG. 21 are circuits equivalent to the polarity inversion circuits X1 to X3 shown in FIGS. 23 to 25, respectively. The polarity inversion circuit X1 shown in FIG. 23 is configured to be arranged immediately after the input terminals Ina and Inb by using the switches X1a and X1b for switching the straight/cross connection of the wiring, and by inputting the polarity inversion signal flf, the analog input signal Vinp and Vinm can be switched. As a result, the input unit of the polarity inversion circuit for receiving the input of the analog input signals Vinp and Vinm is configured to perform chopping operation. The input unit may also be referred to as an input circuit or an input device.

The polarity inversion circuit X2 shown in FIG. 24 is a circuit for switching the series wiring connection between the capacitors C5a and C5b and the switches S8a and S8b by using a switch (no reference numeral) for switching the straight/cross connection of the wiring, and the connection can be switched by inputting the polarity inversion signal flf. As a result, the chopping operation is performed before and after the feedback capacitance of the first integrator 12. The feedback capacitor may also be referred to as a feedback capacitor.

The polarity inversion circuit X3 shown in FIG. 25 is a circuit for switching the wiring connection of the capacitors C7a and C7b by using a switch (no reference numeral) for switching the straight/cross connection of the wiring, and the connection can be switched by inputting the polarity inversion signal flf. As a result, the chopping operation is performed before and after the feedback capacitance of the second integrator 13.

Further, the inversion circuit X4 in FIG. 21 is a circuit capable of switching between normal output and inversion output by inputting a polarity inversion signal flf, and causes the output unit of the second integrator 13 to perform the chopping operation.

The control circuit 14 can switch the connection by sequentially switching the straight/cross connection of the switches X1a, X1b, X2a, X2b, X3a, and X3b using the polarity inversion signal flf. Further, the control circuit 14 is configured to switch between the normal output and the inversion output by switching an available (effective) state and an unavailable (ineffective) state of the inversion circuit X4 using the polarity inversion signal flf.

The control circuit 14 repeats $2^n$ times, for example, 4 times, 8 times, . . . , 128 times, 256 times when the polarity inversion signal flf is an instruction for straight connection, and then, further repeats $2^n$ times with inverting the polarity when the polarity inversion signal flf is an instruction for cross connection. These processes will be repeated sequentially.

As described above, by repeating charging and discharging of the capacitors C1a, C1b, the capacitively-coupled amplifier 11 amplifies the analog input signals Vinp and Vinm, and the first integrator 12 integrates and outputs the output charge. After that, by inverting the connection using the polarity inversion circuits X1 to X3, the charge based on the offset input in the forward direction to the capacitors C1a, C1b, C5a, C5b, C7a, C7b can be discharged in the reverse direction.

Then, the offset accumulated sequentially by repeating $2^n$ times can be cancelled by repeating $2^n$ times reversely, and the influence of the offset can be further reduced as compared with the configuration of the above-described embodiment. Further, according to the present embodiment, the degree of freedom of the acquisition timing by the quantizer 16 (i.e., the comparator) can be increased. The settling time at this time can be secured.

Other Embodiments

The present invention is not limited to the embodiments described above. For example, following modifications or extensions may be made. That is, two or more embodiments described above may be combined to implement the control of the present disclosure. A part of the above-described embodiment may be omitted as long as the difficulty is resolvable, and may provide an example embodiment. In addition, various modifications of the present disclosure may be considered as encompassed in the present disclosure, as long as such modifications pertain to the gist of the present disclosure.

For example, the control circuit 14 generates the control signal φ13_1 (corresponding to the third control signal) that is in synchronization with the master clock φ12. The frequency of the control signal φ13_1 is a half of the frequency of the master clock φ12. The control circuit 14 further generates the control signal φ1d (corresponding to the fourth control signal) through delaying the control signal φ13_1 by a predetermined time. The rising edge of a control signal φ0 (corresponding to the second control signal) is defined based on the rising edge of the control signal φ1d. The turn-on period of the control signal φ0 is a half or less of the turn-on period of the control signal φ1d.

In addition, the control circuit 14 can shorten the turn-on period of the control signal φ0 by producing the edge of the control signal φ0 during the turn-off period based on the edge of the master clock φ12 during the turn-on period or the turn-off period. The frequency of the master clock φ12 is twice of the frequency of the control signal φ1 (corresponding to the first control signal).

Although the present disclosure is described based on the above embodiments, the present disclosure is not limited to the disclosure of the embodiment and the structure. The present disclosure is intended to cover various modification examples and equivalents thereof. In addition, various modes/combinations, one or more elements added/subtracted thereto/therefrom, may also be considered as the present disclosure and understood as the technical thought thereof.

What is claimed is:
1. A delta-sigma modulator comprising:
 a capacitively-coupled amplifier including a sampling capacitor, a feedback capacitor, and an operational amplifier, the capacitively-coupled amplifier configured to amplify an analog input signal;
a first integrator being a correlated double sampling integrator, the first integrator configured to be a first-stage integrator located after the capacitively-coupled amplifier;
a second integrator configured to be located after the first integrator;
a quantizer configured to be located after the second integrator to quantize an output value of the second integrator;
a digital-to-analog converter configured to
execute digital-to-analog conversion of an output of the quantizer, and
execute feedback of the output of the quantizer to the first integrator and the second integrator after the digital-to-analog conversion of the output of the quantizer;
a first switch configured to be connected between an input of the capacitively-coupled amplifier and the sampling capacitor of the capacitively-coupled amplifier to execute a chopping operation;
a second switch configured to be connected between an output of the capacitively-coupled amplifier and an input of the first integrator to execute a chopping operation;
a third switch connected between the second switch and the input of the first integrator; and
a control circuit configured to
execute modulation by controlling the first switch to execute the chopping operation at the input of the capacitively-coupled amplifier,
execute demodulation by controlling the second switch to execute the chopping operation at the output of the capacitively-coupled amplifier, and
import an output signal of the capacitively-coupled amplifier into the first integrator through the third switch after the demodulation.

2. The delta-sigma modulator according to claim 1, wherein, based on a condition that the control circuit drives the first integrator based on a first control signal having a reference frequency with a predetermined phase timing, the control circuit is further configured to:
control the third switch to execute a chopping operation at the input of the first integrator in a timing identical to the predetermined phase timing of the reference frequency; and
control each of the first switch and the second switch to execute the chopping operation at a frequency being equal to a half of the reference frequency of the first control signal.

3. A delta-sigma modulator comprising:
a capacitively-coupled amplifier including a sampling capacitor, a feedback capacitor, and an operational amplifier, the capacitively-coupled amplifier configured to amplify an analog input signal;
a first integrator being a correlated double sampling integrator, the first integrator configured to be a first-stage integrator located after the capacitively-coupled amplifier;
a second integrator configured to be located after the first integrator;
a quantizer configured to be located after the second integrator to quantize an output value of the second integrator;
a digital-to-analog converter configured to
execute digital-to-analog conversion of an output of the quantizer, and
execute feedback of the output of the quantizer to the first integrator and the second integrator after the digital-to-analog conversion for the output of the quantizer;
a first switch configured to be connected between an input of the capacitively-coupled amplifier and the sampling capacitor of the capacitively-coupled amplifier to execute a chopping operation;
a second switch configured to be connected between an output of the capacitively-coupled amplifier and an input of the first integrator to execute a chopping operation; and
a control circuit configured to
execute modulation by controlling the first switch to execute the chopping operation at the input of the capacitively-coupled amplifier,
execute demodulation by controlling the second switch to execute the chopping operation at the output of the capacitively-coupled amplifier, and
import an output signal of the capacitively-coupled amplifier into the first integrator after the demodulation.

4. The delta-sigma modulator according to claim 3, wherein, based on a condition that the control circuit drives the first integrator based on a first control signal having a reference frequency with a predetermined phase timing, the control circuit is further configured to:
control the first switch to execute the chopping operation at a frequency being equal to a half of the reference frequency; and
control the second switch to execute the chopping operation at a frequency being equal to a half of the reference frequency and in a timing being 90 degrees out of phase with a timing of driving the first switch.

5. The delta-sigma modulator according to claim 1, further comprising:
a fourth switch configured to short-circuit each of an input and an output of the operational amplifier to apply DC-bias at an input of the operational amplifier included in the capacitively-coupled amplifier, the operational amplifier being a first operational amplifier; and
a fifth switch configured to short-circuit each of an input and an output of a second operational amplifier included in the first integrator,
wherein the control circuit is further configured to:
drive the fifth switch based on a first control signal having a reference frequency with a predetermined phase timing;
generate a second control signal for turning on the fourth switch in a turn-on period during which the first control signal is at an on-state or a predetermined period shorter than the turn-on period; and
drive the fourth switch based on the second control signal.

6. The delta-sigma modulator according to claim 5, wherein the control circuit is further configured to:
generate a third control signal that has a frequency acquired by dividing a frequency of a master clock by two, and that is in synchronization with the master clock;
generate a fourth control signal that has a phase being 90 degrees out of phase with the third control signal, and that is in synchronization with the master clock;

generate the first control signal through delaying the third control signal by a first predetermined time;

generate a fifth control signal through delaying the third control signal by a second predetermined time or through delaying the first control signal by a third predetermined time; and generate a turn-on period of the second control signal during which the second control signal is at an on-state, by defining a rising edge of the second control signal based on a rising edge of the fifth control signal and defining a falling edge of the second control signal based on a falling edge of the fourth control signal.

7. The delta-sigma modulator according to claim 1, further comprising:

an input part configured to receive the analog input signal, wherein a chopping operation is executed at the input part, and is executed after an output part of the quantizer.

8. The delta-sigma modulator according to claim 7, wherein a chopping operation is executed prior to and after a feedback capacitor of each of the first integrator and the second integrator.

* * * * *